(12) United States Patent
Tamai et al.

(10) Patent No.: US 8,054,674 B2
(45) Date of Patent: Nov. 8, 2011

(54) VARIABLE RESISTIVE ELEMENT, MANUFACTURING METHOD FOR SAME, AND NON-VOLATILE SEMICONDUCTOR MEMORY DEVICE

(75) Inventors: Yukio Tamai, Osaka (JP); Yasunari Hosoi, Osaka (JP); Nobuyoshi Awaya, Osaka (JP); Shigeo Ohnishi, Osaka (JP); Kazuya Ishihara, Osaka (JP); Hisashi Shima, Tsukuba (JP); Hiroyuki Akinaga, Tsukuba (JP); Fumiyoshi Takano, Tsukuba (JP)

(73) Assignees: Sharp Kabushiki Kaisha, Osaka (JP); National Institute of Advanced Industrial Science and Technology, Ibaraki (JP)

( * ) Notice: Subject to any disclaimer, the term of this patent is extended or adjusted under 35 U.S.C. 154(b) by 57 days.

(21) Appl. No.: 12/598,642

(22) PCT Filed: Apr. 7, 2008

(86) PCT No.: PCT/JP2008/056859
§ 371 (c)(1),
(2), (4) Date: Nov. 3, 2009

(87) PCT Pub. No.: WO2008/142919
PCT Pub. Date: Nov. 27, 2008

(65) Prior Publication Data
US 2010/0172170 A1   Jul. 8, 2010

(30) Foreign Application Priority Data

May 10, 2007 (JP) .................... 2007-126016
Nov. 12, 2007 (JP) .................... 2007-292763

(51) Int. Cl.
*G11C 11/00* (2006.01)

(52) U.S. Cl. ........... 365/148; 365/158; 257/43; 257/104
(58) Field of Classification Search ............. 365/148, 365/158; 257/43, 104
See application file for complete search history.

(56) References Cited

U.S. PATENT DOCUMENTS 6,240,139 B1    5/2001    Cao et al.
7,420,198 B2 *  9/2008    Baek et al. ............ 257/2
(Continued)

FOREIGN PATENT DOCUMENTS

JP   2004-363604   12/2004
(Continued)

OTHER PUBLICATIONS

International Search Report for PCT/ JP2008/056859, mailed Jul. 8, 2008.

(Continued)

*Primary Examiner* — Connie Yoha
(74) *Attorney, Agent, or Firm* — Nixon & Vanderhye P.C.

(57) ABSTRACT

Provided is a variable resistive element which performs high speed and low power consumption operation. The variable resistive element comprises a metal oxide layer between first and second electrodes wherein electrical resistance between the first and second electrodes reversibly changes in accordance with application of electrical stress across the first and second electrodes. The metal oxide layer has a filament, which is a current path where the density of a current flowing between the first and second electrodes locally increases. A portion including at least the vicinity of an interface between the certain electrode, which is one or both of the first and second electrodes, and the filament, on an interface between the certain electrode and the metal oxide layer is provided with an interface oxide which is an oxide of at least one element included in the certain electrode and different from the oxide of the metal oxide layer.

25 Claims, 26 Drawing Sheets

U.S. PATENT DOCUMENTS

| | | |
|---|---|---|
| 7,894,239 B2 * | 2/2011 | Tamai et al. ............ 365/148 |
| 2004/0245557 A1 | 12/2004 | Seo et al. |
| 2007/0159868 A1 | 7/2007 | Sugita et al. |
| 2007/0159869 A1 * | 7/2007 | Baek et al. ............ 365/148 |
| 2007/0267667 A1 | 11/2007 | Ufert |
| 2008/0117664 A1 | 5/2008 | Kinoshita et al. |

FOREIGN PATENT DOCUMENTS

| | | |
|---|---|---|
| JP | 2005-229015 | 8/2005 |
| JP | 2007-184419 | 7/2007 |
| WO | WO 2007/013174 | 2/2007 |
| WO | WO 2007/020832 | 2/2007 |

OTHER PUBLICATIONS

Liu, S. Q. et al., "Electric-pulse-induced reversible Resistance change effect in magnetoresistive films", Applied Physics Letter, vol. 76, pp. 2749-2751, (2000).

Baek, I. G. et al., "Highly Scalable Non-volatile Resistive Memory using Simple Binary Oxide Driven by Asymmetric Unipolar Voltage Pulses", IEDM Technical Digest, pp. 587-590, (2004).

Ogimoto, Y. et al., "Resistance switching memory device with a nanoscale confined path", Applied Physics Letter, vol. 90, 143515, (2007).

* cited by examiner

Fig. 3A
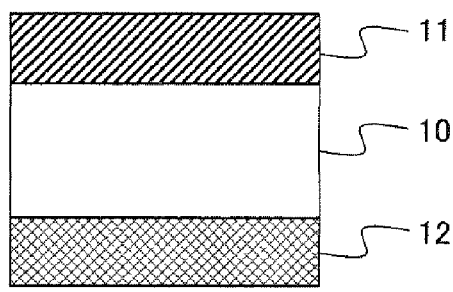
 First forming process
Fig. 3B
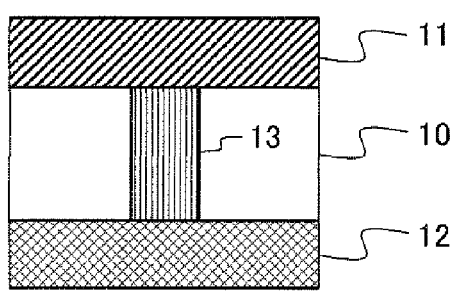
 Second forming process
Fig. 3C
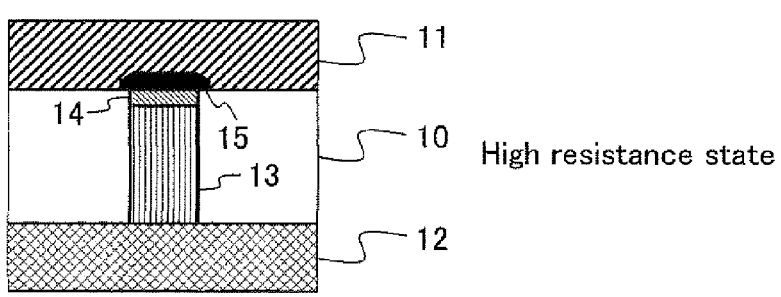
High resistance state
Resetting operation ⇧  ⇩ Setting operation
Fig. 3D
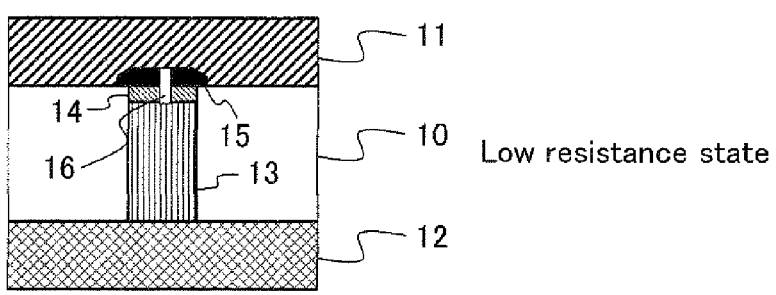
Low resistance state Fig. 4A
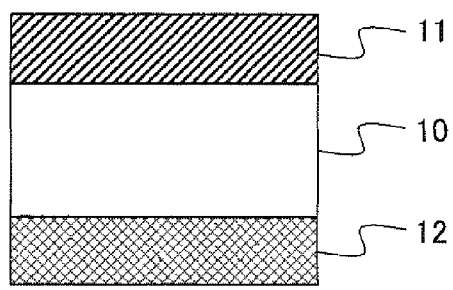
 First forming process
Fig. 4B
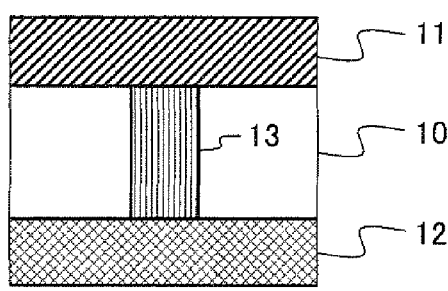
 Second forming process
Fig. 4C
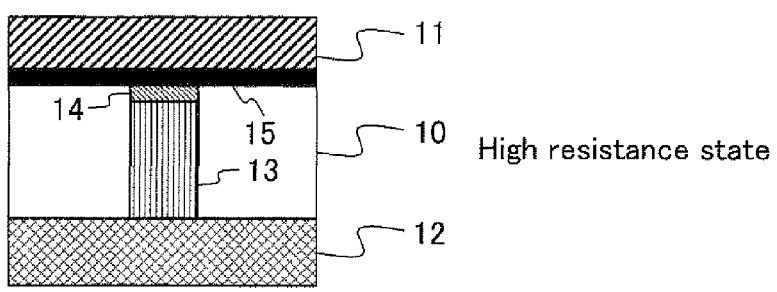
High resistance state
Resetting operation   Setting operation
Fig. 4D
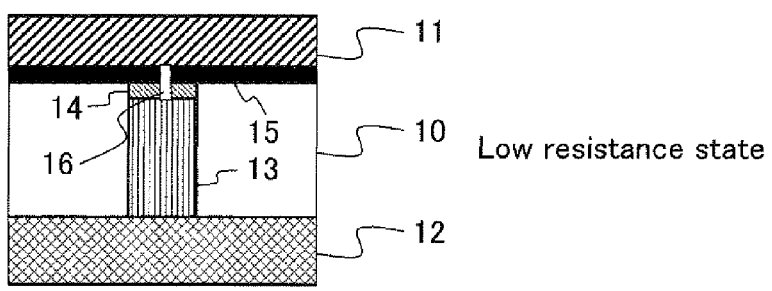
Low resistance state

 First forming process

There is no change.  Second forming process

Low resistance state
Setting operation   Resetting operation High resistance state

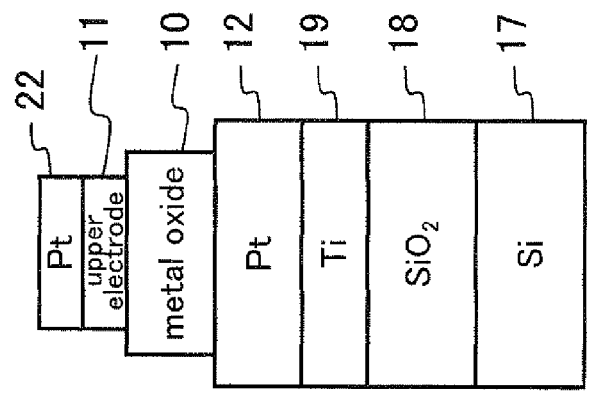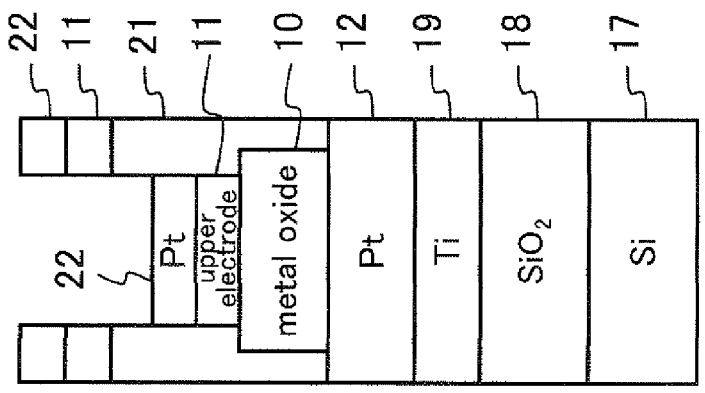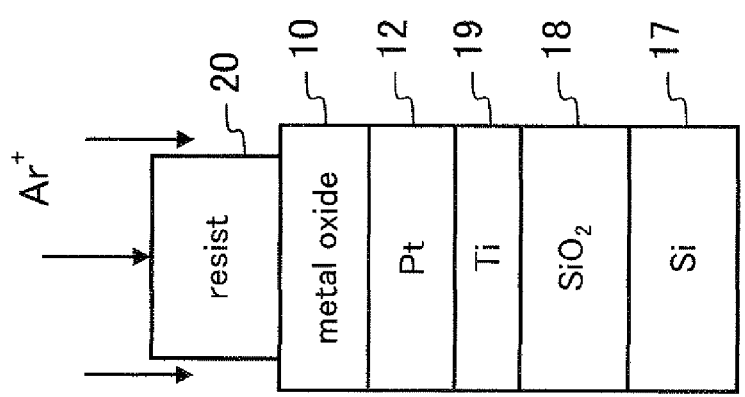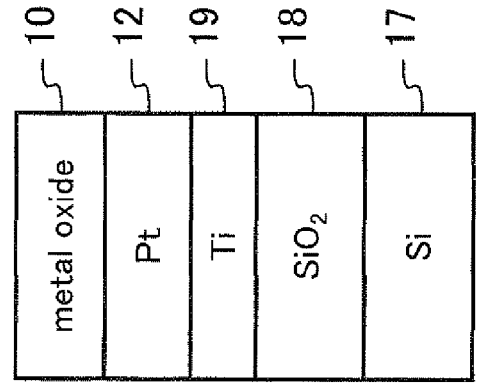

⇩ First forming process
Second forming process

Low resistance state

⇧ Setting operation  ⇩ Resetting operation

High resistance state

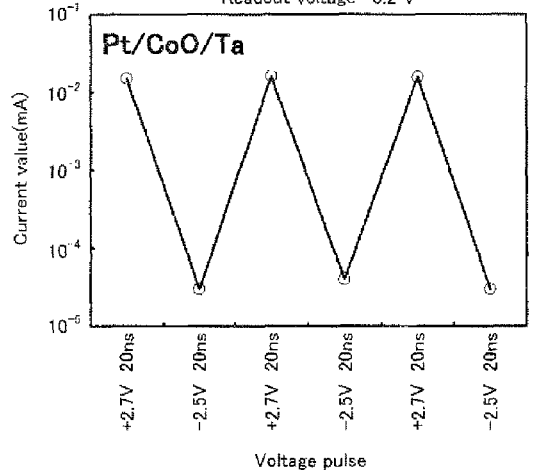
Fig. 23A
Fig. 23B
Fig. 23C
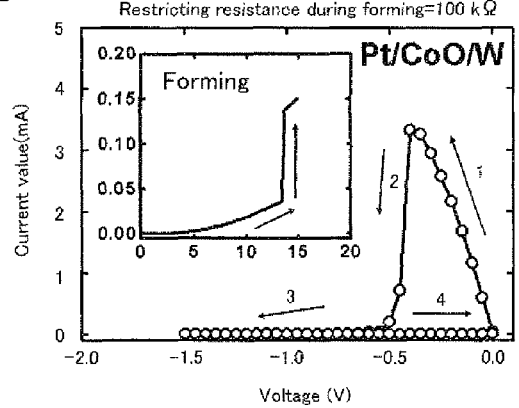
Fig. 23D
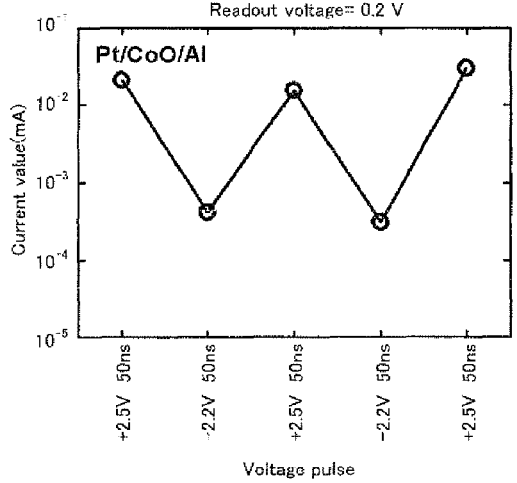
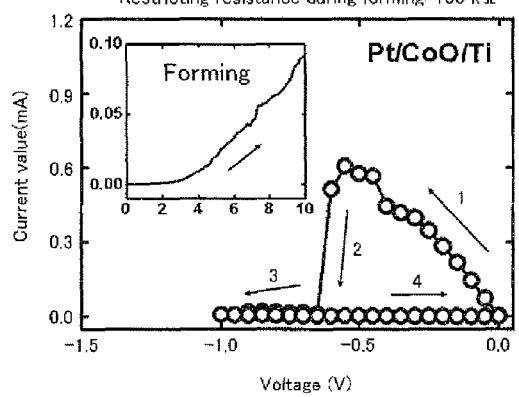
Fig. 23E
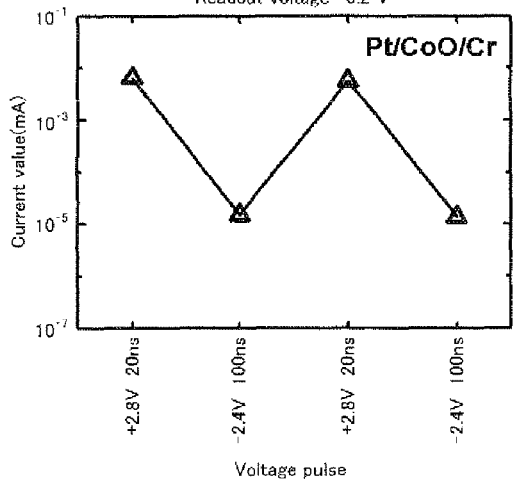

VARIABLE RESISTIVE ELEMENT, MANUFACTURING METHOD FOR SAME, AND NON-VOLATILE SEMICONDUCTOR MEMORY DEVICE

CROSS-REFERENCE TO RELATED APPLICATIONS

This application is a National Phase filing under 35 U.S.C. §371 of International Application No. PCT/JP2008/056859 filed on Apr. 7, 2008, and which claims priority to Japanese Patent Applications No. 2007-126016 filed on May 10, 2007 and No. 2007-292763 filed on Nov. 12, 2007.

TECHNICAL FIELD

The present invention relates to a variable resistive element which can store information when an electrical resistance changes in accordance with application of an electrical stress, a manufacturing method for the same, and a non-volatile semiconductor memory device. In particular, the present invention relates to a variable resistive element which can perform high speed and low power consumption operation without reversible variable resistive properties of a metal oxide being damaged as a result of combination of a metal oxide material and an electrode material, a manufacturing method for the same, and a non-volatile semiconductor memory device.

BACKGROUND ART

In recent years, a capacity of non-volatile semiconductor memory devices, such as flash memories, has significantly increased, and products having a capacity of approximately 4 gigabytes have been sold at a price of approximately several tens of thousands of yen. In particular, a commercial value of portable or mobile memories, such as USB memories, has been increasing in such a manner as to grab a market that had been occupied by magneto-optical discs. In addition, the capacity of several gigabytes is sufficient for the storage in portable music players. Portable music players equipped with a non-volatile semiconductor memory device that is a solid element successfully appeal to users as being fundamentally superior as a solid element memory with regards to resistance to vibration, reliability and power consumption over portable music players equipped with a hard disc that has been spreading rapidly, and thus, are expected to be a mainstream storage system for portable or mobile products for music and images as described above.

In the case where a further increase in the capacity and reduction in the cost per bit are realized in the future, it would be possible for the non-volatile semiconductor memory devices to be used as the storage system for portable or mobile products which records and replays videos, and therefore, the next generation non-volatile semiconductor memory devices have been researched. In particular, the next generation non-volatile semiconductor memory devices may substitute for DRAMs used as a main memory in current information apparatuses if they can maintain a low cost and small cell area (not more than $4F^2$:F is the minimum processing size in manufacturing process) which are advantages of flash memories and overcome the following restrictions due to the principle of operation of flash memories: (1) high voltage for program/erasure (requiring a booster circuit), (2) slow operation for program/erasure (in particular, time for erasure exceeding 100 μsec), and (3) the limited number of times memory can be written (less than $10^6$ times). As a result, it becomes possible to implement a so-called "instant on computer" which starts up instantly at the time of use and of which the power consumption is infinitely close to zero during standby.

Although non-volatile memory elements based on their own principles, such as ferroelectric memories (FeRAM) and magnetic memories (MRAM) have been researched and developed as candidates for this next generation non-volatile semiconductor memory device, it is difficult to outperform flash memories in such features as low cost per byte and small cell area.

Under such circumstances, phase change memories (PRAM), resistance change memories (RRAM) and the like attract interest because there is a possibility that they may exceed the low cost per bit of the flash memories. The resistance change memories are referred to herein as non-volatile memory devices where the electrical resistance can be changed when a voltage (or a current) not less than a threshold voltage (or a threshold current) is applied to a variable resistor sandwiched by electrodes in such a manner that this state of resistance is maintained in a non-volatile manner even after the application of a voltage (or a current) is once released, and information corresponding to different states of resistance can be stored.

For example, the following Patent Document 1 and Non-Patent Document 1 disclose "methods for changing the resistance value by applying a voltage pulse having a different polarity to a thin film made of a perovskite substance sandwiched between a pair of electrodes." However, the perovskite substance has a problem in an affinity with general semiconductor processes, and therefore, a resistance change memory made of a binary oxide having a high affinity with semiconductor processes and a simple composition has been attracting interest, as disclosed in the following Patent Document 2. Patent Document 2 discloses a "non-volatile memory device characterized in that the data storing substance layer is a transition metal oxide film made of NiO, $V_2O_5$, ZnO, $Nb_2O_5$, $TiO_2$, $WO_3$ or CoO having different resistance properties for different voltages and a resistance which suddenly rises in a predetermined voltage range." In fact, the following Non-Patent Document 2 reports an example of a non-volatile resistance change memory element where NiO, $TiO_2$, $ZrO_2$ or $HfO_2$, which are binary transition metal oxides, is sandwiched between an upper electrode and a lower electrode. In addition, the following Non-Patent Document 3 discloses a resistance change memory element in such a form that two electrodes are electrically connected via a metal with which a hole penetrating through an insulating film is filled in.

Patent Document 1: U.S. Pat. No. 6,204,139
Patent Document 2: Japanese Unexamined Patent Publication No. 2004-363604
Non-Patent Document 1: Liu, S. Q. et al. "Electric-pulse-induced reversible Resistance change effect in magnetoresistive films," Applied Physics Letter, Vol. 76, pp. 2749-2751, 2000
Non-Patent Document 2: Back, I. G. et al. "Highly Scalable Non-volatile Resistive Memory using Simple Binary Oxide Driven by Asymmetric Unipolar Voltage Pulses," IEDM Technical Digest, pp. 587-590, 2004
Non-Patent Document 3: Ogimoto, Y. et al. "Resistance switching memory device with a nanoscale confined path," Applied Physics Letter, Vol. 90, 143515, 2007

DISCLOSURE OF THE INVENTION

A resistance change memory made of a binary transition metal oxide, as disclosed in Patent Document 2 and Non-Patent Document 2, has a high affinity with semiconductor processes and a simple structure and composition as described above, and has an advantage in that it can be easily applied for a non-volatile memory having high integration. On the other hand, the resistance change memory has problems with switching properties such that a rate of switching from a low resistance state to a high resistance state is low (not less than approximately μsec), and in addition, a current required for the switching is large (not less than approximately mA), and as a result, the power required for switching to a high resistance state is large.

The resistance change memory element disclosed in Non-Patent Document 3 has a structure where two electrodes are connected via a metal with which a through hole in an insulating film sandwiched between the electrodes is filled in, and thus has a structure which is different from the structure of elements where a metal oxide is sandwiched between electrodes as reported in many documents, including Non-Patent Document 2. The element has a structure which makes a high speed operation possible, and it is expected that the difficulty in restricting inconsistencies at the microscopic level between elements will become a problem with implementing a memory having high integration, in particular, when the size of the elements become close to the size of the microscopic holes which are filled in with a metal.

Taking the above-described technical problems with the related art into consideration, the present inventors diligently examined switching mechanisms and concrete combinations of metal oxides and materials for electrodes in element structures where the readout margin is secured, the resistance value in a low resistance state is controlled, the power consumption is restricted within a range appropriate for practical use even in the case where the element is applied for a practical non-volatile memory with high integration, and a high speed operation is possible. Accordingly, the present inventors have arrived at the present invention of which the details thereof are described below.

The present invention is provided in order to solve the above-described technical problems and is concretely defined by technical characteristics shown in the following.

That is, a variable resistive element according to the present invention is a variable resistive element comprising a metal oxide layer between a first electrode and a second electrode where an electrical resistance between the first and second electrodes reversibly changes in accordance with application of an electrical stress across the first and second electrodes, and is characterized as a first characteristic in that the metal oxide layer has a filament which is a current path where the density of a current flowing between the first and second electrodes is locally high, and a portion including at least the vicinity of an interface between a certain electrode, which is one or both of the first and second electrodes, and the filament, on an interface between the certain electrode and the metal oxide layer is provided with an interface oxide which is an oxide of a certain element and different from an oxide of the metal oxide layer, the certain element being at least one element included in the certain electrode.

Herein, the application of the electrical stress across the first and second electrodes means applying an electrical stress of one or both of a voltage and a current across the first and second electrodes.

The variable resistive element according to the first characteristic has an element structure where an interface oxide intervenes between a filament which is a current path where the density of a current flowing between the first and second electrodes of the variable resistive element is locally high, and a certain electrode, and therefore, the current path contributing to the electrical resistance of the variable resistive element becomes a local filament portion formed so as to penetrate the interface oxide between a filament body primarily formed through a filament forming process and the certain electrode. In this case, the film thickness of the interface oxide is small in comparison with the metal oxide layer, and therefore, conditions for voltage application for forming the local filament portion so as to penetrate through the interface oxide are mitigated greatly in comparison with the conditions for forming the filament main body, and therefore, an inconsistency in the electrical resistance can naturally be restricted. In other words, a change in the resistance state of the variable resistive element, that is, the switching operation, is brought about through conduction and disconnection of the local filament portion, and therefore, the switching operation can be carried out with low power consumption and a high speed, and an inconsistency in the electrical resistance can be suppressed.

In addition to having the first characteristic, the variable resistive element according to the present invention is characterized as a second characteristic by comprising a current narrow portion where the current path for the filament is narrowed by the interface oxide in the vicinity of a contact point between the filament and the interface oxide.

In the variable resistive element according to the second characteristic, a local filament portion penetrating through the interface oxide is formed as a current narrow portion, and thus, inconsistency in the electrical resistance in a low resistance state, in which the second and first electrodes are electrically connected, is suppressed, and the electrical resistance can be prevented from becoming too low. As a result, the consumption of the current at the time of switching from a low resistance state to a high resistance state can be suppressed.

There are still many unclear points in the mechanism of switching phenomenon that can be seen in the metal oxides, where the resistance state changes through the application of a voltage pulse, and there is considered a switching model where the filament formed in a metal oxide is electrically connected or disconnected due to the movement of oxygen throughout part or the entirety of the filament when a voltage pulse is applied so that the resistance state changes is possible. For example, there is a switching model where the resistance lowers when oxygen moves through application of a voltage pulse for setting the resistance, so that there is excessive oxygen or lack of oxygen for the composite of which the metal to oxygen ratio is set in the metal oxide, and the resistance increases when the variable resistive element is heated through application of a voltage pulse for resetting the resistance so that excessive oxygen or lack of oxygen is rectified. In particular, Joule heat is considered to play a significant role at the time of resetting.

Accordingly, an operation with low power at high speed may become possible as a result of the double effects of the current density being higher in the current narrow portion than in the surroundings, and therefore, increase in a temperature due to Joule heat is effectively accelerated, and a distance required for oxygen to move in order to change the resistance being shorter.

In addition to having any of the above-described characteristics, the variable resistive element according to the present invention is characterized as a third characteristic in that the thermal conductivity of the interface oxide is lower than the thermal conductivity of the certain electrode.

In the variable resistive element having the third characteristic, Joule heat can be effectively prevented from diffusing through the certain electrode having a high thermal conductivity by means of the interface oxide in the case where the local filament portion formed in the interface oxide is heated by the Joule heat, and therefore, increase in the temperature due to Joule heat is efficiently accelerated in the filament portion, so that the operation with low power and at high speed is accelerated.

In addition to having the first or second characteristic, the variable resistive element according to the present invention is characterized as a fourth characteristic in that the free energy for generating an oxide in the certain element is less than the free energy for generating an oxide in a metal element that forms the metal oxide layer.

The variable resistive element having the fourth characteristic makes it possible to form an interface oxide through exchange of oxygen between the material for the certain electrode and the metal oxide, so that the manufacturing process for the variable resistive element can be simplified. That is, the free energy for generating an oxide of the element that forms the certain element is less than the free energy for generating an oxide of the metal element that forms the metal oxide, and therefore, a certain element in the certain electrode grabs oxygen from the metal oxide layer for oxidation, and thus, an interface oxide is formed in the interface between the certain electrode and the metal oxide layer. In addition, the thermal conductivity is generally lower in oxides of metals than in the metals, and therefore, an interface oxide having a heat confining effect and a lower thermal conductivity than the certain electrode can be automatically formed as described above.

It should be noted that the intensity of the free energy for generating an oxide is the value including a plus or minus sign, and not the absolute value. For example, the free energy for generating an oxide of −1000 kJ/mol may be less than −500 kJ/mol. In addition, the free energy for generating an oxide is dependent on the temperature, and it is preferable for the material to be selected based on the size in a temperature range of approximately 25° C. to 1000° C.

In addition to having any of the above-described characteristics, the variable resistive element according to the present invention is characterized as a fifth characteristic in that the metal oxide layer is made of a metal oxide including a transition metal. In particular, it is preferable for the metal oxide layer to be an oxide of at least one transition metal selected from Co, Ni, Ti, V, Cu, W, Nb and Mn.

In the case where the metal oxide layer is made of a metal oxide including a transition metal, there may be a phenomenon where the resistance changes due to the movement of oxygen in part or the entirety of the filament formed between the first and second electrodes, judging from the disclosure in Patent Document 1 and Non-Patent Document 1, and therefore, the variable resistive element having the fifth characteristic has the effect of the present invention, such that the switching operation can be implemented more stably at a higher speed and with low power consumption, because an interface oxide is provided in the interface between the certain electrode and the metal oxide layer.

In addition to having the fifth characteristic, the variable resistive element according to the present invention is characterized as a sixth characteristic in that the certain electrode includes at least one element that is selected from W, Cr, Ta and Al and different from the transition metal included in the metal oxide layer.

The variable resistive element having the sixth characteristic makes it easy to form an interface oxide in the interface between the metal oxide layer and the certain electrode through heat treatment or application of a voltage in the case where the metal oxide layer is made of a metal oxide including a transition metal.

In addition to having any of the above-described characteristics, the variable resistive element according to the present invention is characterized as a seventh characteristic in that the electrical resistance between the first and second electrodes reversibly changes when oxygen moves between the interface oxide and the metal oxide.

In the variable resistive element having the seventh characteristic, it is sufficient that the oxygen is exchanged in the local filament portion that penetrates through the interface oxide, and effective switching of the resistance state can be implemented. That is, the element structure with the interface oxide in the present invention can be said to be an element structure that is appropriate for a switching model where the resistance state changes when the filament formed in the metal oxide is electrically connected or disconnected due to the movement of oxygen in part or the entirety of the filament through application of a voltage pulse.

In addition to having any of the above-described characteristics, the variable resistive element according to the present invention is characterized as an eighth characteristic in that the electrical resistance between the first and second electrodes increases when one of the first electrode and the second electrode is used as a reference and a first voltage pulse having a positive or negative polarity is applied to the other electrode, and the electrical resistance between the first and second electrodes decreases when a second voltage pulse having a polarity opposite to the first voltage pulse is applied to the other electrode.

In the case where the interface oxide is formed only in the first electrode or the second electrode, the element structure of the variable resistive element having the eighth characteristic becomes asymmetric between the first and second electrodes, and therefore, the current voltage characteristics are dependent on the polarity of the applied voltage pulse, and therefore, when the first voltage pulse for increasing the resistance and the second voltage pulse for lowering the resistance have a different polarity, a switching operation that is appropriate for the element structure becomes possible, and a stable switching operation can be secured.

In addition to having any of the above-described characteristics, the variable resistive element according to the present invention is characterized as a ninth characteristic in that duration of a first voltage pulse which is applied across the first and second electrodes in order to increase the electrical resistance between the first and second electrodes and duration of a second voltage pulse which is applied across the first and second electrodes in order to decrease the electrical resistance between the first and second electrodes are 100 ns or less.

In the variable resistive element having the ninth characteristic, the element structure with an interface oxide specific to the present invention makes it possible to lower the power consumption and increase the speed of the switching operation, and therefore, the switching operation is possible even when the time during which the first voltage pulse is applied for increasing the resistance and the second voltage pulse for lowering the resistance is applied is 100 ns or less.

In addition, the manufacturing method for a variable resistive element according to the present invention is a manufacturing method for a variable resistive element having the first characteristic, and characterized as a first characteristic by comprising: forming an original structure for the variable resistive element having the metal oxide layer between the first electrode and the second electrode; forming a filament which is a current path where a density of a current flowing through the metal oxide layer between the first and second elements is locally high by applying a first forming voltage across the first and second electrodes in the original structure; and forming an interface oxide in a portion including at least the vicinity of an interface between a certain electrode, which is one or both of the first and second electrodes, and the filament, on an interface between the certain electrode and the metal oxide layer, the interface oxide being an oxide of a certain element which is at least one element included in the certain electrode and being different from an oxide in the metal oxide layer, wherein the original structure forming step, the filament forming step and the interface oxide forming step are carried out in sequence.

According to the manufacturing method for a variable resistive element having the first characteristic, a filament is formed in a metal oxide layer through forming steps in two stages, and furthermore, an interface oxide is formed in the interface between the formed filament and the certain electrode, and therefore, the presence of the interface oxide allows a current narrow portion for connecting and disconnecting the filament to be formed in a portion of the interface between the interface oxide and the filament, so that increase in the speed of the switching operation and reduction in power consumption can be accelerated.

Furthermore, in addition to having the first characteristic, the manufacturing method for a variable resistive element according to the present invention is characterized as a second characteristic in that the interface oxide is generated when the certain element in the certain electrode grabs oxygen in the metal oxide layer through the interface in the interface oxide forming step.

According to the manufacturing method for a variable resistive element having the second characteristic, it is not necessary to form an interface oxide separately and independently in the interface between the metal oxide layer and the certain electrode, so that the manufacturing process for a variable resistive element can be simplified.

Furthermore, in addition to having the second characteristic, the manufacturing method for a variable resistive element according to the present invention is characterized as a third characteristic in that a filament disconnecting portion having a high resistance for suppressing current conduction in the filament is formed in the interface between the filament and the interface oxide in addition to formation of the interface oxide in the interface oxide forming step.

Furthermore, in addition to having the third characteristic, the manufacturing method for a variable resistive element according to the present invention is characterized as a fourth characteristic in that a current path penetrating through the filament disconnecting portion and the interface oxide is formed by applying a voltage across the first and second electrodes in order to decrease the electrical resistance between the first and second electrodes, so that a current narrow portion where the current path in the filament is narrowed is formed in the vicinity of the contact point between the filament and the interface oxide after the interface oxide forming step.

According to the manufacturing method for a variable resistive element having the third or fourth characteristic, the electrical resistance between the first and second electrodes is set to a high resistance state immediately after the interface oxide forming step. Accordingly, as with the fourth characteristic, when a predetermined voltage is applied across the first and second electrodes after the interface oxide forming step, a current path penetrating through the filament disconnecting portion and the interface oxide is formed so that the electrical resistance between the first and second electrodes can be set to a low resistance state and a switching operation for changing the electrical resistance between the first and second electrodes in a reversible manner can be concretely implemented.

Furthermore, in addition to having any of the second to fourth characteristics, the manufacturing method for a variable resistive element according to the present invention is characterized as a fifth characteristic in that the certain electrode and the metal oxide layer are formed in the original structure forming step so that the free energy for generating an oxide of the certain element included in the certain electrode is less than the free energy for generating an oxide of a metal element that forms the metal oxide layer.

According to the manufacturing method for a variable resistive element having the fifth characteristic, the free energy for generating an oxide of an element that forms the certain electrode is less than the free energy for generating an oxide of the metal element that forms the metal oxide, and therefore, the certain element of the certain electrode grabs oxygen from the metal oxide layer and is oxidized, so that an interface oxide is formed in the interface between the certain electrode and the metal oxide layer. In addition, the thermal conductivity of oxides is generally lower than the metals, and therefore, the interface oxide having a heat containing effect with a lower thermal conductivity than the certain electrode may be automatically formed, as described above.

Furthermore, in addition to having any of the first to fifth characteristics, the manufacturing method for a variable resistive element according to the present invention is characterized as a sixth characteristic in that the interface oxide is generated by applying a second forming voltage across the first and second electrodes in the interface oxide forming step.

Furthermore, in addition to having any of the first to fifth characteristics, the manufacturing method for a variable resistive element according to the present invention is characterized as a seventh characteristic in that the interface oxide is generated by carrying out heat treatment on the interface between the certain electrode and the metal oxide layer in the interface oxide forming step.

According to the manufacturing method for a variable resistive element having the sixth or seventh characteristic, the interface oxide forming step can be carried out through a simple process, such as voltage application or heat treatment, after the formation of an original structure for a variable resistive element, and therefore, the manufacturing process for a variable resistive element can be simplified.

Furthermore, in addition to having the first characteristic, the manufacturing method for a variable resistive element according to the present invention is characterized as an eighth characteristic in that the interface oxide forming step is carried out in parallel with the filament forming step using a current that flows during the filament forming step.

According to the manufacturing method for a variable resistive element having the eighth characteristic, the filament forming step and the interface oxide forming step can be carried out as one forming step, and therefore, the formation of a filament in a metal oxide layer and the formation of an interface oxide in the interface between the formed filament and the certain electrode are possible at the same time or approximately at the same time, so that the presence of the interface oxide allows a current narrow portion for connecting and disconnecting the filament to be formed in a portion of the interface between the interface oxide and the filament, and therefore, increase in the speed of the switching operation and reduction in the power consumption can be accelerated.

Furthermore, in addition to having the eighth characteristic, the manufacturing method for a variable resistive element according to the present invention is characterized as a ninth characteristic in that a current is restricted to 1 mA or less during the filament forming step.

According to the manufacturing method for a variable resistive element having the ninth characteristic, the interface oxide can be efficiently generated during one forming step, so that the current can be reduced at the time of the resetting operation.

Furthermore, in addition to having the eighth or ninth characteristic, the manufacturing method for a variable resistive element according to the present invention is characterized as a tenth characteristic in that the interface oxide is generated when the certain element in the certain electrode grabs oxygen in the metal oxide layer through the interface in the interface oxide forming step.

According to the manufacturing method for a variable restive element having the tenth characteristic, it is not necessary to form an interface oxide separately and independently in the interface between the metal oxide layer and the certain electrode, and thus, the manufacturing process for a variable resistive element can be simplified.

Furthermore, in addition to having the tenth characteristic, the manufacturing method for a variable resistive element according to the present invention is characterized as an eleventh characteristic in that a current narrow portion where the current path of the filament is narrowed by the interface oxide is generated in the vicinity of a contact point between the filament and the interface oxide in the interface oxide forming step.

Furthermore, in addition to having the tenth characteristic, the manufacturing method for a variable resistive element according to the present invention is characterized as a twelfth characteristic in that a filament disconnecting portion having a high resistance for restricting current conduction of the filament is formed in an interface between the filament and the interface oxide by applying a voltage across the first and second electrodes in order to increase the electrical resistance between the first and second electrodes after the interface oxide forming step.

According to the manufacturing method for a variable resistive element having the eleventh or twelfth characteristic, the electrical resistance between the first and second electrodes is set to a low resistance state immediately after the interface oxide forming step. Accordingly, as the twelfth characteristic, a predetermined voltage is applied across the first and second electrodes after the interface oxide forming step, so that a filament disconnecting portion having a high resistance for suppressing the current conduction in the filament in the interface between the filament and the interface oxide, and thus, the electrical resistance between the first and second electrodes can be set to a high resistance state and the switching operation for changing the electrical resistance between the first and second electrodes in a reversible manner can be implemented concretely.

Furthermore, in addition to having any of the tenth to twelfth characteristics, the manufacturing method for a variable resistive element according to the present invention is characterized as a thirteenth characteristic in that the certain electrode and the metal oxide layer are formed in the original structure forming step so that the free energy for generating an oxide of the certain element included in the certain electrode is less than the free energy for generating an oxide of a metal element that forms the metal oxide layer.

According to the manufacturing method for a variable resistive element having the thirteenth characteristic, the free energy for generating the oxide of the element that forms the certain electrode is less than the free energy for generating the oxide of the metal element that forms the metal oxide, and therefore, the certain element in the certain electrode grabs oxygen from the metal oxide layer and is oxidized to form an interface oxide in the interface between the certain electrode and the metal oxide layer. In addition, the oxides generally have a lower thermal conductivity than the metals, and therefore, an interface oxide having a heat containing effect with a lower thermal conductivity than the certain electrode can be automatically formed, as described above.

The nonvolatile semiconductor memory device according to the present invention is characterized by comprising: a memory cell having a variable resistive element having any of the above-described characteristics; information writing means for programming and erasing information by applying power across the two ends of the variable resistive element and changing the electrical resistance; and information readout means for reading out stored information by applying a readout voltage across the two ends of the variable resistive element and detecting the electrical resistance state from the amount of current flowing through the resistive element.

According to the nonvolatile semiconductor memory device having the above-described characteristics, a high-performance nonvolatile semiconductor memory device where the margin for the readout operation with little inconsistency in the resistance from among memory cells is large, and the memory state of a memory cell can be written with low power consumption and at high speed can be provided at low cost.

According to the variable resistive element according to the present invention, the combination of the material for the metal oxide layer and the material for the certain electrode can be selected so that the power consumption can be reduced at the time of the switching operation for raising or lowering the electrical resistance between the first and second electrodes, and at the same time, the speed of the switching operation can be increased while saving on materials in comparison with cases where an expensive electrode of a precious metal, such as platinum, is used. Accordingly, the power consumption for the switching operation can be reduced and the speed can be increased when the variable resistive element according to the present invention is applied to a nonvolatile semiconductor memory device for practical use. Furthermore, inconsistency in the electrical resistance between the variable resistive elements can be suppressed, and therefore, the margin of the readout operation also increases.

BRIEF DESCRIPTION OF THE DRAWINGS

FIGS. 3A to 3D are schematic cross sectional diagrams showing first and second forming process steps in a manufacturing method for a variable resistive element, and a change in the element structure during a switching operation according to one embodiment of the present invention.

FIGS. 4A to 4D are schematic cross sectional diagrams showing first and second forming process steps in a manufacturing method for a variable resistive element, and the change in the element structure during the switching operation according to another embodiment of the present invention.

FIGS. 6A to 6D are schematic cross sectional diagrams showing original structure forming steps in the manufacturing method for a variable resistive element according to one embodiment of the present invention following the process procedure along with the change in the element structure.

FIGS. 23A to 23E are graphs showing the switching properties of the variable resistive element in each sample according to one embodiment (Example 10) of the present invention.

EXPLANATION OF REFERENCES

Figure 1:
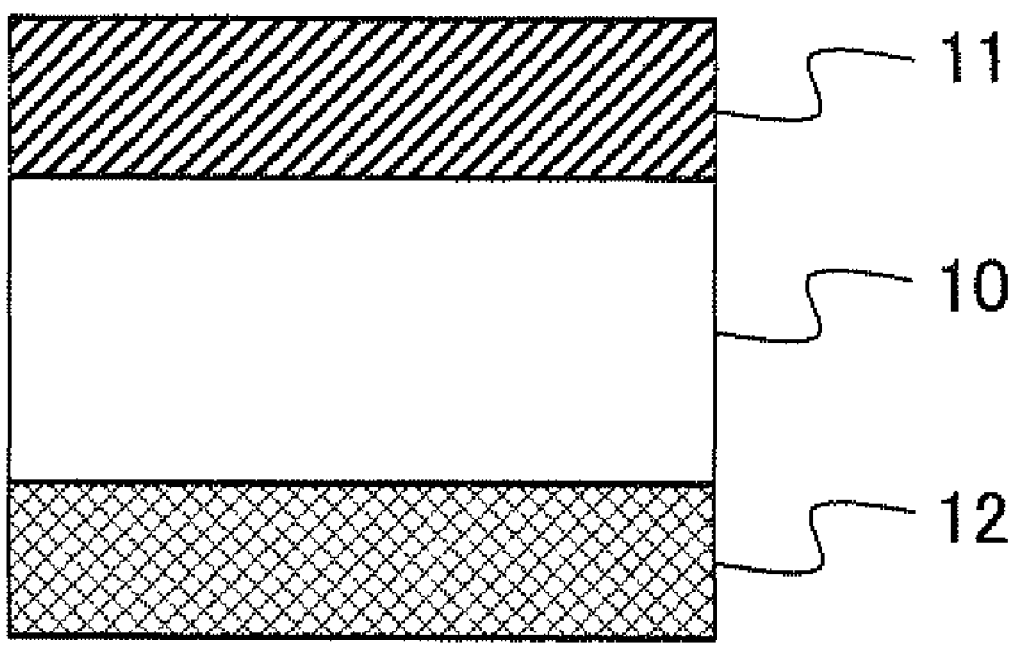
FIG. 1 is a schematic cross sectional diagram showing an original structure before first and second forming processes for a variable resistive element according to an embodiment of the present invention.

10: Metal oxide layer
11: First electrode (certain electrode)
12: Second electrode
13: Filament
14: Filament disconnecting portion
15: Interface oxide
16: Current narrow portion
17: Si substrate
18: Thermal oxide film
19: Ti layer (adhesive layer)
20: Photoresist
21: Photoresist
22: Pt layer (capping layer)
30: Voltage pulse generator
31: Direct current voltage source
32: Direct current ammeter
33: Switch
40: Memory cell array
41: Bit line decoder
42: Word line decoder
43: Control circuit
44: Voltage switching circuit
45: Readout circuit
46: Voltage generating circuit
47: Address line
48: Data line
49: Control signal line
50: Memory cell BL, BL1 to BLm: Bit line
WL, WL1 to WLn: Word line
Vcc: Power supply voltage
Vss: Ground voltage
Vpp: Voltage for program.
Vee: Voltage for erasure
Vrd: Voltage for readout

BEST MODE FOR CARRYING OUT THE INVENTION

In the following, variable resistive element according to embodiments of the present invention, a manufacturing method for the same and a nonvolatile semiconductor memory device (hereinafter referred to as "element according to the present invention," "method according to the present invention" and "device according to the present invention") are described with reference to the drawings.

First Embodiment

Figure 2:
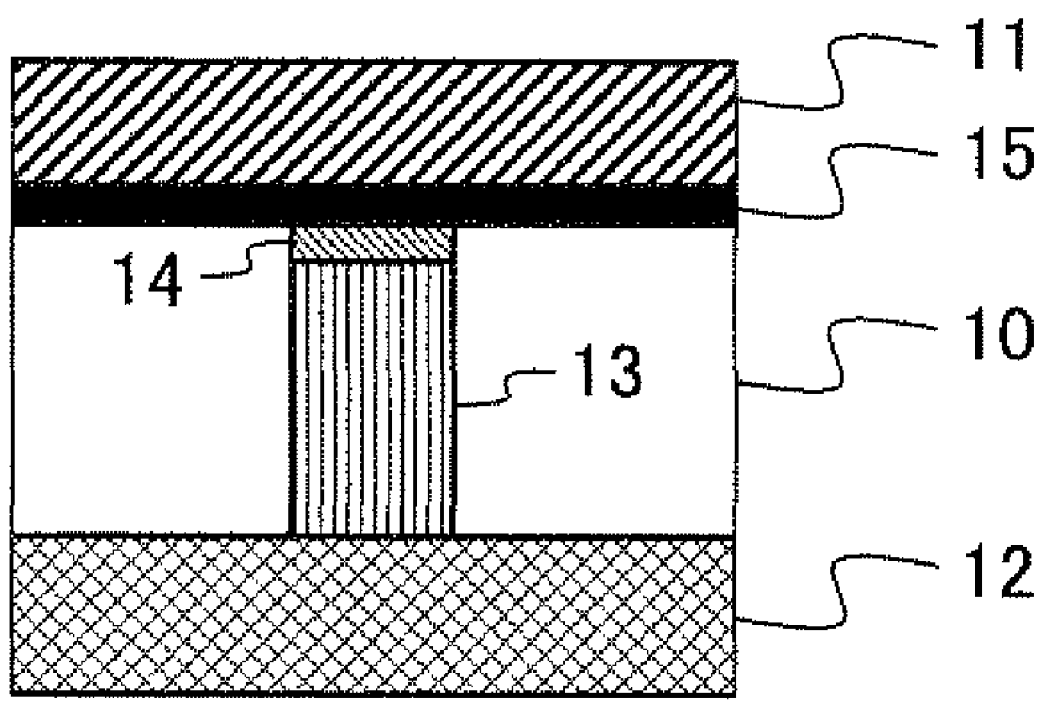
FIG. 2 is a schematic cross sectional diagram showing an element structure before the first and second forming processes for the variable resistive element according to an embodiment of the present invention.

An element and a method according to a first embodiment of the present invention are described below with reference to FIGS. 1 to 24. The variable resistive element according to the present invention is a variable resistive element having an original structure with a metal oxide layer 10 between a first electrode 11 and a second electrode 12 as an element structure, as shown in FIG. 1, and an electrical resistance between the first and second electrodes 11 and 12 changes in a reversible manner in accordance with application of electrical stress across the first and second electrodes 11 and 12. In addition, in this variable resistive element, a filament 13, which is a current path where a density of a current flowing between the first and second electrodes 11 and 12 is locally high, is formed in the metal oxide layer 10 in a "forming" process described below, and part or the entirety of the filament 13 in FIG. 2 is connected or disconnected through a switching operation described below, so that the electrical resistance between the first and second electrodes 11 and 12 changes. Accordingly, the above-described original structure in the element according to the present invention is the element structure before the "forming" process.

In the following description, the operation for changing the electrical resistance between the first and second electrodes in a reversible manner, that is, an operation for lowering the resistance, during which the variable resistance element transitions from a high resistance state to a low resistance state, and an operation for increasing the resistance, during which the variable resistance element transitions from a low resistance state to a high resistance state, is referred to as the switching operation. In addition, for the sake of convenience, in the description, the operation for lowering the resistance is referred to as "setting" or "setting operation," and the operation for increasing the resistance is referred to as "resetting" or "resetting operation."

Furthermore, the "forming" process carried out on the variable resistive element according to the present invention is generally a preprocess required before the switching operation, and an operation for forming a filament 13 (see FIG. 2) which is required in the metal oxide layer 10 during the switching operation. In the method according to the present invention, however, the process for forming a filament 13 through which a current easily flows is referred to as a first forming process (or step), and a reverse process for narrowing a portion of the current path of the formed filament 13 so that it becomes difficult for a current to flow is referred to as a second forming process (or step), and thus, the two forming processes are distinguished from one another. Accordingly, in the case where a process is simply referred to as a "forming" process, it generally means a filament forming process. In addition, although FIG. 2 shows a single filament in a simple form for one variable resistive element, this is to make the description easier. The filament is a conductive path where the current density is locally high, and a plurality of filaments may be provided in one element, or one filament may branch into a plurality of filaments, providing a complex structure.

There are still many unclear points in the mechanism for the switching phenomenon, where the resistance state changes through the application of a voltage pulse in the metal oxide layer of the variable resistive element according to the present invention. The filament in the metal oxide that is formed in advance through a forming process may have a switching model where the filament is connected or disconnected due to a movement of oxygen throughout a part or the entirety of the filament when a voltage pulse is applied, so that the resistance changes. This is a switching model where oxygen moves through the application of a voltage pulse for setting the resistance so that there is excessive oxygen or insufficient oxygen in a constant ratio composition of the metal and oxygen in the metal oxide, and the resistance lowers, and where the variable resistive element is heated through the application of a voltage pulse for resetting the resistance so that the excessive oxygen or insufficient oxygen is rectified, and the resistance increases. In particular, Joule heat is considered to play a great role at the time of resetting.

Accordingly, the present inventors took two approaches to making a high speed switching operation possible with lower power: first, they efficiently heated the variable resistive element at the time of resetting, and second, they made a region for changing the resistance of the filament as small as possible, so that a distance over which the oxygen is required to move for changing the resistance became shorter.

The Joule heat generated by the current flowing through the filament as a result of application of electrical stress (for example a voltage pulse) is stored and conveyed in accordance with a specific heat and a thermal conductivity of a surrounding substance, and determines a temperature of the variable resistive element. At this time, some of the Joule heat generated in the metal oxide layer diffuses into the first and second electrodes. Therefore, the present inventors found out that an oxide thin film (corresponding to an interface oxide) having a low thermal conductivity formed in the interface between one or both of the first and second electrodes (corresponding to the certain electrode) and the metal oxide layer in a self-aligned manner works as a heat diffusion preventing film, and as a result the resetting operation becomes possible at low power. Furthermore, it is clear that when an interface oxide is selectively provided in the vicinity of the area where the filament and the electrode come into contact, the resistance changing portion is restricted, and thus, effects of lowering the power consumption and increasing the speed can be enhanced.

First, the first approach, according to which the variable resistive element can be efficiently heated at the time of resetting, will be described. According to the first approach, a material having a low thermal conductivity may be provided in the vicinity of the interface when the portion that changes the resistance is in the vicinity of the interface between the electrode and the metal oxide. FIG. 2 schematically shows a basic structure where there is an interface oxide 15 between the first electrode 11 (corresponding to the certain electrode in the present embodiment) and the metal oxide layer 10. FIG. 2 shows a state in which a filament disconnecting portion 14 is formed in the interface between the filament 13 and the interface oxide 15 at the time of formation of the interface oxide 15 (at the time of the second forming process), that is, a state in which the filament 13 is disconnected and the resistance increases. As described below, when a current narrow portion 16 (see FIG. 3) is formed in the filament 13 penetrating through part of the interface oxide 15 and the filament disconnecting portion 14 through application of a voltage pulse for setting the resistance, the filament 13 is connected and the resistance of the element according to the present invention lowers.

It is possible to form the interface oxide 15 by exchanging oxygen between the material for the certain electrode 11 and the metal oxide layer 10. When the interface oxide 15 is formed through exchange of oxygen between the certain electrode 11 and the metal oxide layer 10, it becomes possible to simplify the manufacturing process for the element according to the present invention. Specifically, the certain electrode 11 is oxidized through heat treatment or the like, so that an interface oxide 15 is formed when the free energy for generating the oxide of the element that forms the certain electrode 11 is less than the free energy for generating the oxide of the metal element that forms the metal oxide layer 10. Metal oxides generally have a lower thermal conductivity than the metals, and therefore, a heat diffusion preventing film having the above-described heat containing effect is provided. Furthermore, as described below, the portion mainly changing the resistance of the filament 13, that is, the portion which disconnects and connects the filament 13 in the current narrow portion 16 that penetrates through the filament disconnecting portion 14 and the interface oxide 15 in the metal oxide layer 10 formed through a setting operation after the first and second forming processes, is formed in the filament disconnecting portion 14 on the interface oxide 15 side, and therefore, the speed of the resetting operation can be increased using the properties that oxygen easily moves from the metal oxide layer 10 to the interface oxide 15.

Next, the second approach, according to which the distance required for the oxygen to move in order to change the resistance can be shortened, will be described. Taking into consideration the fact that the resetting operation increases the resistance by disconnecting the current path when part or the entirety of the filament 13 is disconnected as a result of movement of oxygen, it is possible to increase the speed of operation by making the filament 13 more narrow so that the distance required for oxygen to move over can be shortened. At the same time, the resistance value of the filament 13 is considered to determine the resistance value in the low resistance state, and therefore, the resistance value in the low resistance state can be increased by making the filament 13 more narrow, and thus, it is possible to reduce the current consumed during the resetting operation.

However, filaments 13 are generally formed through a forming process using a breakdown phenomenon, and therefore, it is theoretically difficult to control the thickness, and the resistance value in the low resistance state may be a very low resistance value, for example of several tens of ohms, causing the resetting current (current flowing through the variable resistive element during the resetting operation) to increase. Thus, the present inventors devised a method for lowering the resetting current while at the same time lowering the current and increasing the speed of the switching operation by forming a filament 13 in a first forming process and then narrowing the same using an interface oxide 15. In the method according to the present invention, a technique for narrowing the filament 13 using exchange of oxygen between the material of the certain electrode 11 and the metal oxide layer 10 is adopted.

In the following, the first and second forming processes (respectively corresponding to the first and second forming steps) in the method according to the present invention are described in detail with reference to FIGS. 3A to 4D.

FIGS. 3A to 3D schematically show the process for switching the resistance state in a reversible manner through the first and second forming processes, starting from the original structure for the element according to the present invention, and repeating the setting operation and the resetting operation. First, a voltage (first forming voltage) is applied across the first and second electrodes 11 and 12 in order to carry out a first forming process on the original structure (FIG. 3A), where the metal oxide layer 10 is sandwiched between the first electrode 11 and the second electrode 12, so that a filament 13 which is to become a current path between the first and second electrodes 11 and 12 (portion where the density of the current flowing between the first and second electrodes 11 and 12 is locally high) is formed (FIG. 3B). As described above, it is generally difficult to control the thickness of the filament 13, and the resistance value of the low resistance state tends to be low. Next, a voltage (second forming voltage) is applied across the first and second electrodes 11 and 12 in order to carry out a second forming process, so that an interface oxide 15 for partially sandwiching the thick filament 13 formed in the first forming process is formed (FIG. 3C). As shown in FIG. 3C, Joule heat is generated through application of the second forming voltage in the second forming process, and in the case where the free energy for generating the oxide of the element (certain element) that forms the material for the first electrode (certain electrode) 11 is less than the free energy for generating the oxide of elements other than oxygen that form the metal oxide layer 10, oxygen is supplied from the metal oxide layer 10 to the first electrode 11, and an interface oxide 15 is formed of the certain element that forms the first electrode 11. In addition, a filament disconnecting portion 14 may be formed also in the vicinity of the interface between the filament 13 and the interface oxide 15 as a result of movement of oxygen from the surrounding metal oxide 10. The resistivity of the filament 13 immediately after the first forming process is significantly lower than that of the metal oxide layer 10, and therefore, the composition ratio of oxygen is considered to be significantly different in the surrounding metal oxide layer 10. Therefore, the interface oxide 15 generated when oxygen is supplied from the metal oxide 10 side is considered to be formed in the vicinity of the area where the filament 13 comes into contact with the first electrode 11 with the film thickness and composition inconsistent. As a result of this inconsistency, only a small part of the interface oxide 15 has an electrically weak portion with a low withstand voltage. Accordingly, as shown in FIG. 3D, a current path 16 (corresponding to the current narrow portion) is formed in a weak portion of the interface oxide 15 at the time of the following setting operation, and therefore, the current path 16 can be made narrower than the filament 13. Although the filament 13 remains, the resistance value between the first and second resistance electrodes 11 and 12 is dominated by the resistance value of the current narrow portion 16 in the filament (current path) penetrating through the interface oxide 15 and the filament disconnecting portion 14. As a result, the resistance value in the low resistance state can be made high after the setting operation, so that the resetting current is reduced at the time of the following resetting operation. In addition, the current narrow portion 16 penetrating through the interface oxide 15 is narrow, and therefore, the distance over which oxygen is required to move at the time of the resetting operation become shorter, and thus, it becomes possible to increase the speed of the resetting operation. Furthermore, oxygen can easily move to the current narrow portion 16 formed in the interface oxide 15 from the metal oxide layer 10, and therefore, it is possible to increase the speed of the resetting operation by forming a current narrow portion 16 in the interface oxide 15. Furthermore, the thermal conductivity of oxides is generally lower than the thermal conductivity of the single elements that form the oxides, and therefore, the heat containing effect is high in the vicinity of the current narrow portion 16 when the interface oxide 15 is generated, and further increase in the speed of the resetting operation can be expected, because the movement of oxygen accelerates.

The second forming process for forming the interface oxide 15 may be carried out through heat treatment, as shown in FIGS. 4A to 4D, instead of applying a second forming voltage across the first and second electrodes 11 and 12, as shown in FIGS. 3A to 3D. As shown in FIGS. 4A and 4B, the first forming process for applying a first forming voltage is the same as the first forming process shown in FIGS. 3A and 3B. The second forming process is carried out through heat treatment instead of applying a second forming voltage across the first and second electrodes 11 and 12 after the first forming process (FIG. 4C). In this case, an interface oxide 15 is formed throughout the entire interface between the first electrode 11 and the metal oxide layer 10, in addition to in the vicinity of the interface between the filament 13 and the first electrode 11, unlike in the case shown in FIG. 3C. However, as described above, the resistivity of the filament 13 immediately after the first forming process is significantly lower than that of the metal oxide layer 10, and therefore, the composition ratio of oxygen is considered to be significantly different in the surrounding metal oxide layer 10, and thus, the interface oxide 15 may be formed inconsistent in the vicinity where the filament 13 and the first electrode 11 comes into contact. Accordingly, as shown in FIG. 4D, a current path 16 (corresponding to the current narrow portion) is formed in a weak portion of the interface oxide 15 at the time of the following setting operation, and therefore, the current path 16 can be made narrower than the filament 13. The following process is the same as in the case shown in FIGS. 3A to 3D, and therefore, descriptions thereof are not repeated.

Figure 5A:
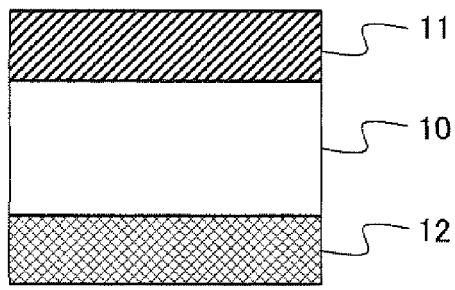
FIGS. 5A to 5D are schematic cross sectional diagrams showing first and second forming process steps for a conventional variable resistive element using a material formed of an element having more free energy for generating an oxide than free energy for generating an oxide of the metal element that forms a metal oxide layer in a certain electrode and the change in the element structure during the switching operation.
Figure 5B:
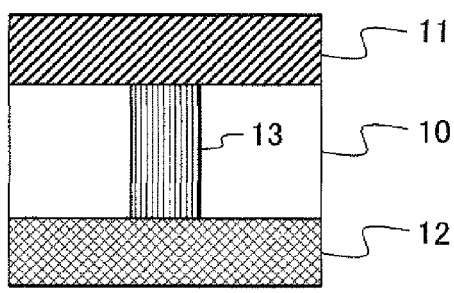
Figure 5C:
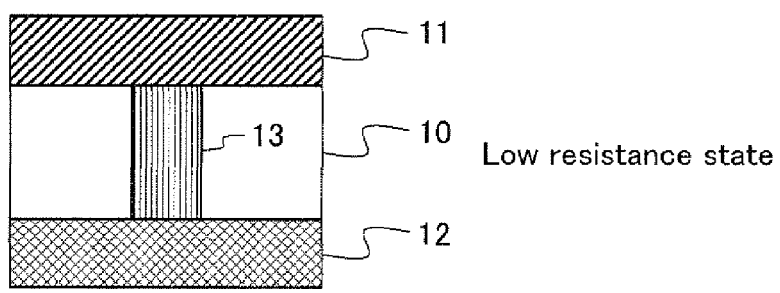
Figure 5D:
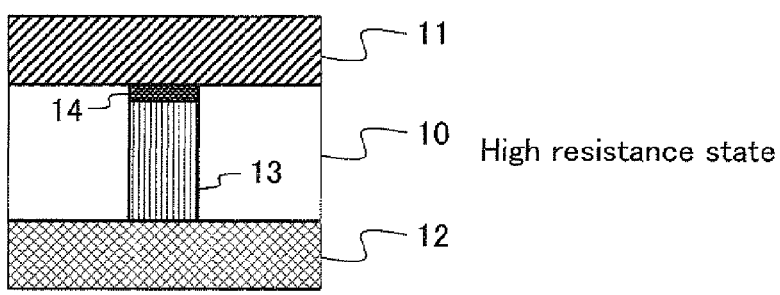

The first electrode (certain electrode) 11 and the metal oxide layer 10 are formed so that the free energy for generating the oxide of the element included in the certain electrode 11 (corresponding to the certain element) is less than the free energy for generating the oxide of the metal element that forms the metal oxide layer 10 when the metal oxide layer 10 shown in FIGS. 3A and 4A forms an original structure sandwiched between the first electrode 11 (certain electrode) and the second electrode 12 (corresponding to the original structure forming step). In the case where the first electrode (certain electrode) is made of a material formed of an element having more free energy for generating an oxide than for generating the oxide of the metal element that forms the metal oxide layer (such as platinum (Pt), which is generally used for the upper electrode in conventional variable resistive elements), it is difficult to form the interface oxide 15 through application of a voltage and heat treatment, as shown in FIGS. 3C and 4C. As a result, even when a first forming process through application of a first forming voltage is carried out on the original structure shown in FIG. 5A (FIG. 5B), and a second forming process through application of a voltage and heat treatment is then carried out, the structure is in a low resistance state, in which a thick filament 13 is formed, as after the first forming process, as shown in FIG. 5C. Accordingly, even when a voltage is applied across the first and second electrodes 11 and 12, the switching operation is carried out when the filament 13 is disconnected and connected in such a state that the interface oxide 15 is not formed, that is, the filament 13 is thick, the resistance value in the low resistance state is low, the resetting current is great, and the resetting speed is slow.

Although a case where the first forming and the second forming are clearly distinguished from one another is described above, it is also possible to carry out the second forming in parallel with the first forming. During the first forming, a current naturally flows together with the breakdown, and as a result, heat is generated. As a result of heat being generated, the first electrode (certain electrode) takes away oxygen from the metal oxide layer 10, so that the interface oxide 15 can be formed. In this case, the filament forming process resulting from breakdown, which should originally be achieved through the first forming, and the current narrowing process using the interface oxide resulting from the second forming compete with each other and therefore, control of the flowing current is considered to be important.

Next, the original structure forming step of forming an original structure where the metal oxide layer 10 is sandwiched between the first electrode 11 (certain electrode) and the second electrode 12 before the first and second forming processes in the method according to the present invention, as shown in FIGS. 3A and 4A, is described in detail with reference to FIGS. 6A to 6D. First, as shown in FIG. 6A, a Ti layer 19, a Pt layer 12, which is a lower electrode (corresponding to the second electrode) and a metal oxide layer 10 are deposited on top of an Si substrate 17 with a thermally oxidized film 18 in this order by an RF magnetron sputtering method, so that a multilayer structure of Ti/Pt/metal oxide layer is formed. In this case, the Ti layer 19 works as an adhesive material for improving the adhesion of the Pt layer 12, which is a lower electrode, to the substrate 17, and is formed as a film by sputtering a gas of 100% Ar against a Ti target under such conditions that the RF output is 200 W, the pressure is 0.5 Pa and the temperature of the substrate is room temperature. Next, the Pt layer 12, which is a lower electrode, is formed as a film by sputtering a gas of 100% Ar under such conditions that the RF output is 100 W, the pressure is 0.3 Pa and the temperature of the substrate is room temperature.

Meanwhile, the metal oxide layer 10 is formed as a film through a deposition process in an Ar atmosphere where the RF output is 200 W, the gas pressure is 0.5 Pa and the temperature of the substrate is room temperature. The composition of the metal oxide layer 10 can be adjusted appropriately by adding an $O_2$ gas.

The film thickness of the metal oxide layer 10 is 50 nm, for example. The film thickness of the metal oxide layer 10 is preferably set in a range from 2 nm to 100 nm, due to the requirements of the circuit operation discussed below, and more preferably from 5 nm to 50 nm. That is, as for the resistance state of the variable resistive element, it is necessary for the variable resistive element to have a switching operation when a voltage pulse for setting the variable resistive element and a voltage pulse for resetting the variable resistive element are applied by means of a drive circuit formed of conventional semiconductor devices, and therefore, there is an appropriate range for the electrical resistance between the first and second electrodes 11 and 12 which sandwich the metal oxide layer 10 after the forming process, and there is also an appropriate range for the film thickness of the metal oxide layer 10, in which the resistance value within the above-described appropriate range can be implemented. Specifically, the film thickness of the metal oxide layer 10 is within the above-described range of 2 nm to 100 nm, taking into consideration that the drive voltage for the peripheral circuit is lower than the amplitude of the voltage pulse for setting and resetting the variable resistive element. Furthermore, it is more desirable for the film thickness to be 5 nm to 50 nm for the convenience of design in the electronic device.

Next, as shown in FIG. 6B, element isolation is achieved through photolithography, using an i line scale-down projection type exposure apparatus (stepper) and Ar ion milling. The Ar ion milling is carried out by applying a voltage of 300 V. Electron beam drawing, contact mask alignment or other methods can be used as the element isolation method in the method according to the present invention. Then, the remaining photoresist 20 is removed, so that the metal oxide layer 10 is exposed, and another photoresist 21 is applied as shown in FIG. 6C, so that a metal layer, which is the upper electrode 11, and a Pt layer 22, which is a capping layer, are deposited by an RF magnetron sputtering method. In this case, a deposition process is carried out for the film formation of the metal layer, which is the upper electrode 11, by the RF magnetron sputtering in an Ar atmosphere with the temperature of the substrate at room temperature. The thickness of the metal layer, which is an upper electrode 11, is 50 nm, for example. Furthermore, the film formation for the Pt layer 22, which is a capping layer for preventing oxidation, may be carried out in the same manner as the film formation for the Pt layer which is the lower electrode 12. Thereafter, as shown in FIG. 6D, the remaining photoresist 21 is removed, so that the Pt layer, which is the lower electrode 12, is exposed. It should be noted that the form of the original structure for the element according to the present invention in the cross section shown in FIG. 6D is provided in order to make the fabrication of the element and the experiments described below simple, and not necessarily the same as the form of the structure in a cross section in the case where practically applied for a nonvolatile semiconductor memory device. As the method for film formation used as the method according to the present invention, well known methods such as laser ablation, chemical vapor phase deposition (CVD), oxidation of the metal (surface) and the like can be used, in addition to the above. In addition, a stylus profilometer made by KLA-Tencor Corporation can be used to measure the respective film thicknesses.

Figure 7:
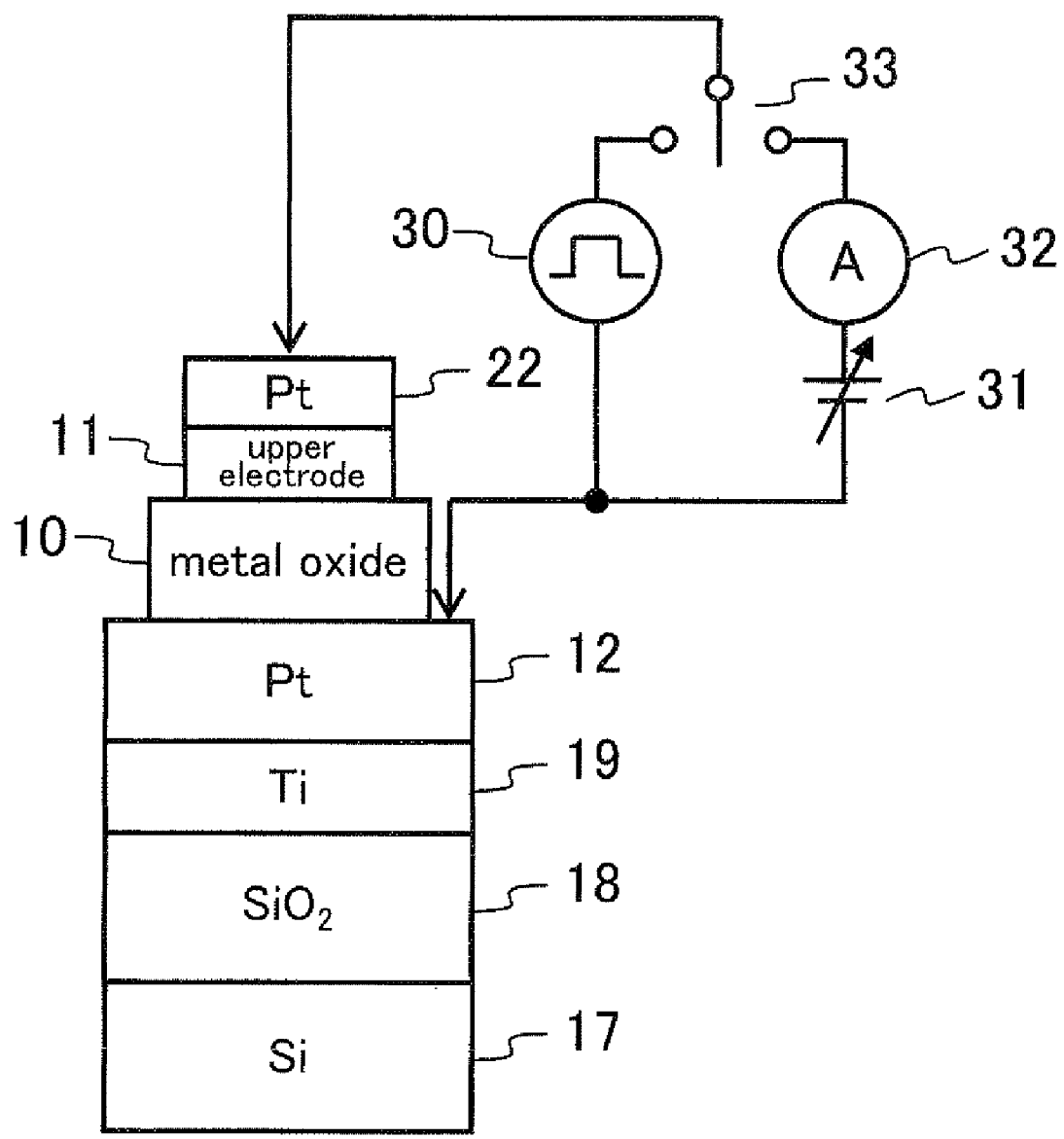
FIG. 7 is a schematic diagram showing an example of a configuration of experimental equipment for performing the first and second forming processes, the switching operation, and measurement of electrical properties of the variable resistive element according to the present invention.

FIG. 7 shows a configuration of an experimental unit with which first and second forming processes were empirically carried out on the element according to the present invention having the original structure shown in FIG. 6D, so that setting and resetting operations were carried out, and the electrical properties of the element according to the present invention were measured after the respective processes. As shown in FIG. 7, the experimental unit was formed of a voltage pulse generator 30, a direct current voltage supply 31, a direct current ammeter 32 and a switch 33.

The voltage pulse generator 30 generates first and second forming voltages during the first and second forming processes, respectively, and generates voltage pulses for setting and resetting the variable resistive element during the setting and resetting operation with predetermined voltage amplitudes and pulse widths (application time), respectively. The direct current voltage supply 31 and the direct current ammeter 32 were used to measure the current voltage (IV) properties and the electrical resistance (voltage pulse response) between the first and second electrodes 11 and 12. The switch 33 is provided to switch between the voltage applying circuit for applying a voltage pulse generated in the voltage pulse generator 30 between the first and second electrodes 11 and 12 and a measurement circuit for measuring the current voltage properties between the first and second electrodes 11 and 12 after the voltage applying operation. A tungsten probe of a prober unit was brought directly in contact with the surface of the first electrode 11 (upper electrode) and the exposed second electrode (lower electrode) 12 formed in the original structure forming step shown in FIGS. 6A to 6D, respectively, so that the above-described voltage applying circuit and measurement circuit were formed, and the IV properties and the voltage pulse response (switching properties) were measured. A semiconductor parameter analyzer 4156C manufactured by Agilent Technologies Inc. was used as the measurement apparatus for the IV properties (direct current voltage supply 31, direct current ammeter 32), and 33250A manufactured by Agilent Technologies Inc. was used as the voltage pulse generator 30, and these were switched by means of the switch 33 for use.

In the following, examples of the method according to the present invention fabricated by the above-described method according to the present invention are described together with the electrical properties thereof.

Example 1

Figure 8:
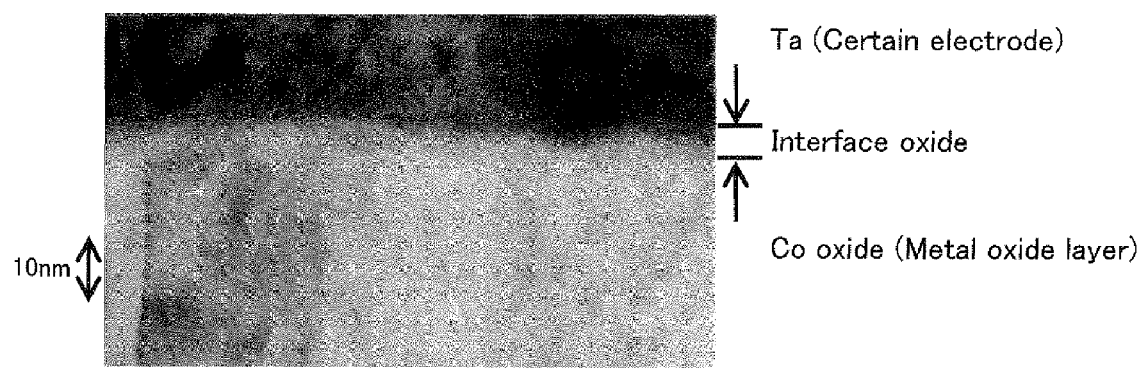
FIG. 8 is a TEM photograph showing a cross sectional structure of the variable resistive element according to one embodiment (Example 1) of the present invention.
Figure 9:
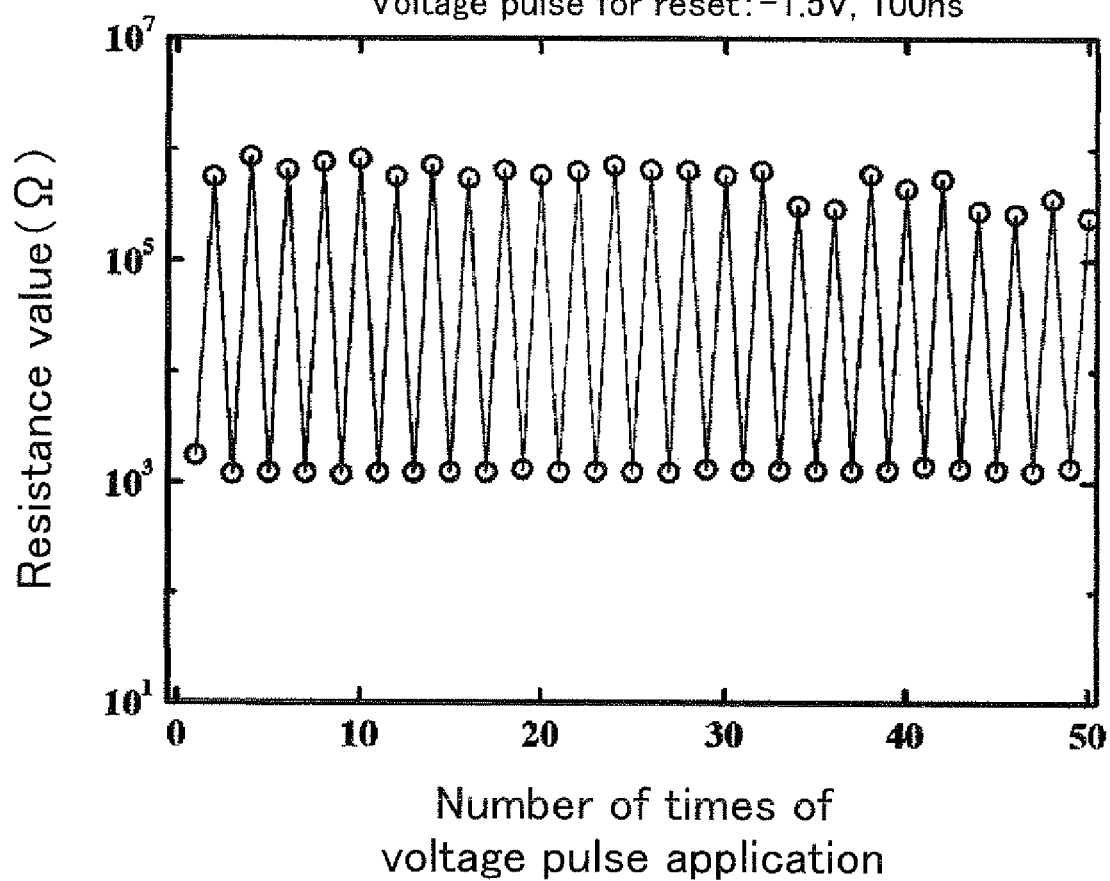
FIG. 9 is a graph showing switching properties and an electrical resistance in a low resistance state and a high resistance state when the variable resistive element according to one embodiment (Example 1) of the present invention carries out a switching operation when positive and negative voltage pulses for setting and resetting a variable resistive element are applied.

The original structure of the element according to the present invention was prototyped by forming films on a silicon substrate with a thermally oxidized film in the order of Ti/Pt (second electrode)/cobalt oxide (metal oxide layer)/Ta (first electrode)/Pt in the above-described mode. In addition, a first forming voltage of +9.9 V was applied to the first electrode with reference to the second electrode, and a second forming process for generating an interface oxide was carried out through heat treatment of 200° C. FIG. 8 shows a TEM photograph showing the element according to the present invention after the second forming process in a cross section. It can be seen that an interface oxide (tantalum oxide) having a thickness of approximately 5 nm was generated in the interface between the Ta electrode (first electrode) and the cobalt oxide (metal oxide layer). FIG. 9 shows the voltage pulse response (switching properties) of this element according to the present invention. It can be seen that the resistance value changes in a reversible manner, making high speed switching possible through the application of a voltage pulse for setting and resetting the variable resistive element of plus or minus 1.5 V for 100 ns.

Example 2

Figure 10:
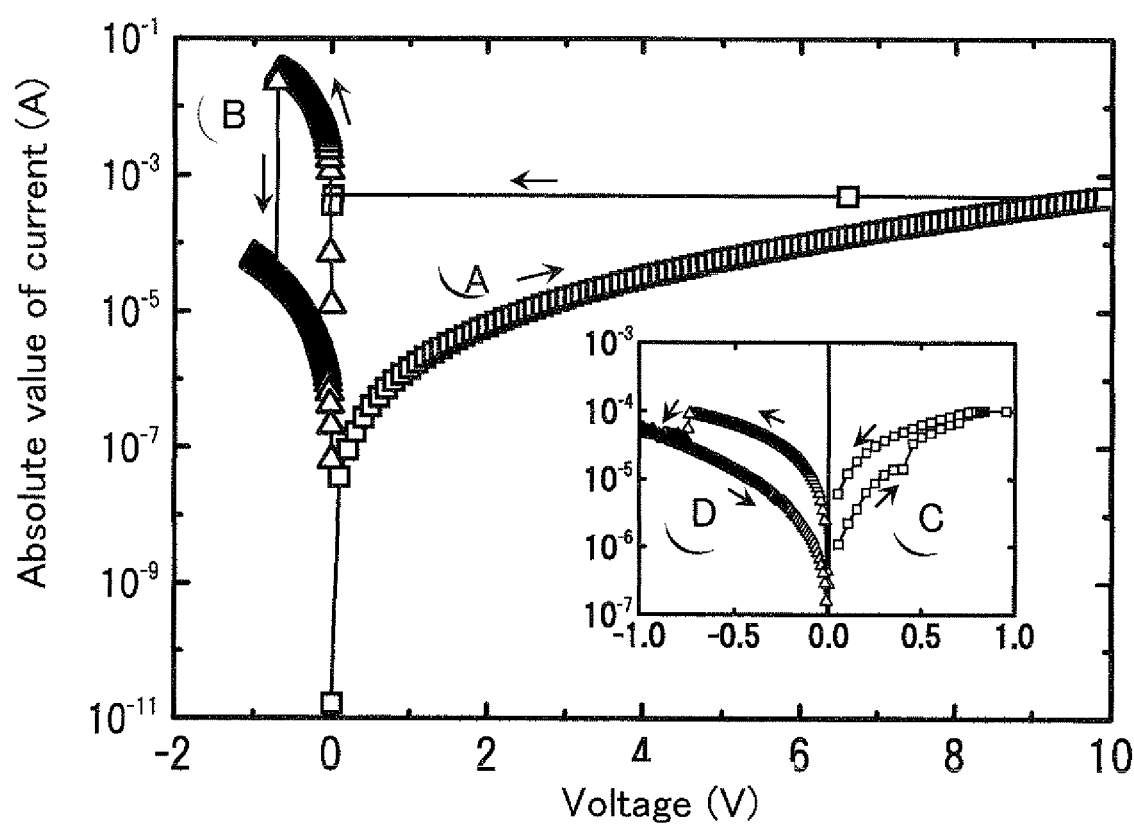
FIG. 10 is a graph showing current voltage properties in the variable resistive element according to one embodiment (Example 2) of the present invention.
Figure 11:
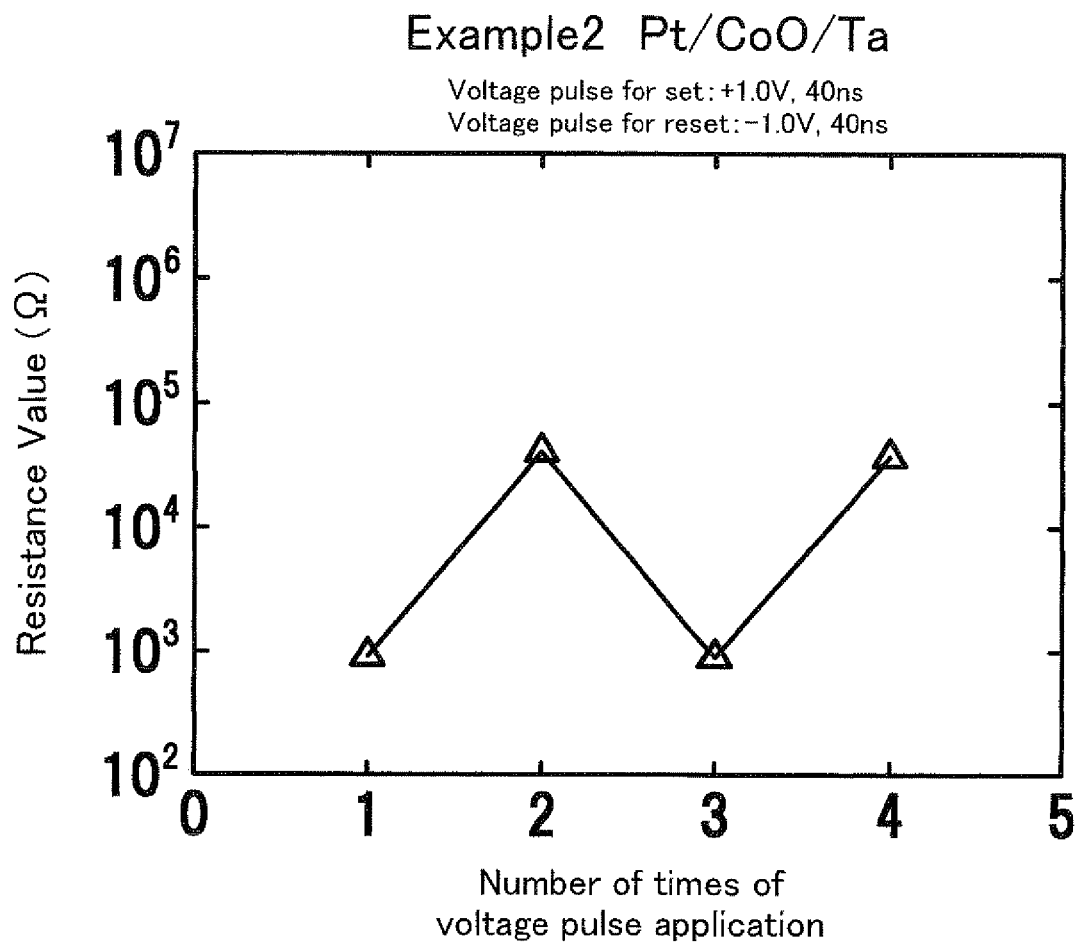
FIG. 11 is a graph showing the switching properties and the electrical resistance in a low resistance state and a high resistance state of the variable resistive element according to one embodiment (Example 2) of the present invention when a switching operation is carried out by applying positive and negative voltage pulses for setting and resetting the variable resistive element.

The original structure of the element according to the present invention was prototyped by forming films on a silicon substrate with a thermally oxidized film in the order of Ti/Pt (second electrode)/cobalt oxide (metal oxide layer)/Ta (first electrode)/Pt in the above-described mode. FIG. 10 shows the IV properties of this element according to the present invention when a voltage is applied across the first and second electrodes. As shown by the arrows in FIG. 10, voltages were applied in the order of A, B, C and D. The voltage application indicated by A is a first forming process where the metal oxide layer is broken down through the application of a voltage of +10 V so that a filament is formed in a temporary low resistance state. The voltage application indicated by B is a second forming process where a large current flows in accordance with the resistance value of the filament in a low resistance state, and the Joule heat oxidizes the Ta electrode and the filament end in the cobalt oxide in the vicinity of the interface between the filament and the Ta electrode (first electrode) so that the filament is disconnected in a high resistance state. At this time, the Ta oxide in the interface is considered to be formed inconsistently as shown in FIG. 3C. The voltage application indicated by C corresponds to a setting operation, and when the voltage amplitude is increased, the disconnected filament again becomes of a conductive state. In this case, only a weak portion, which is a very small portion in the Ta oxide in the interface, becomes of a conductive state, and the resistance value does not become as low as the low resistance state after the first forming indicated by A. Therefore, the current at the time of the resetting operation through the voltage application indicated by D is suppressed to approximately 100 μA. FIG. 11 shows the voltage pulse response (switching properties) of this element according to the present invention. The resistance value changed in a reversible manner through the application of a voltage pulse for setting and resetting the variable resistive element of plus and minus 1.0 V for 40 ns, and thus, it can be seen that high speed switching is possible. In this case, although the forming voltage is 10 V, it can be reduced to several V or less by making the film thickness of the metal oxide layer thinner.

Example 3

Two types of elements according to the present invention and one type of variable resistive element for comparison, that is, a first sample of the element according to the present invention where films were formed on a silicon substrate with a thermally oxidized film in the order of Ti/Pt (second electrode)/cobalt oxide (metal oxide layer)/Ta (first electrode)/Pt in the above-described mode (the first electrode was the Ta electrode), a second sample of the element according to the present invention where films were formed in the order of Ti/Pt (second electrode)/cobalt oxide (metal oxide layer)/W (first electrode)/Pt (the first electrode was the W electrode), and a comparative sample where films were formed in the order of Ti/Pt (second electrode)/cobalt oxide (metal oxide layer)/Pt (first electrode) (first electrode was the Pt electrode), were prepared, and the same switching operation experiment as in Example 1 was carried out for each variable resistive element. The first forming process was carried out by applying a first forming voltage of +10 V, +8.7 V and +7.9 V to the first and second samples and the comparative sample respectively, and the second forming process for generating an interface oxide was carried out by applying a second forming voltage of −0.79 V, −0.60 V and −0.47 V respectively. Here, the second forming process carried out on the comparative sample was considered not to have generated an interface oxide.

Figure 12:
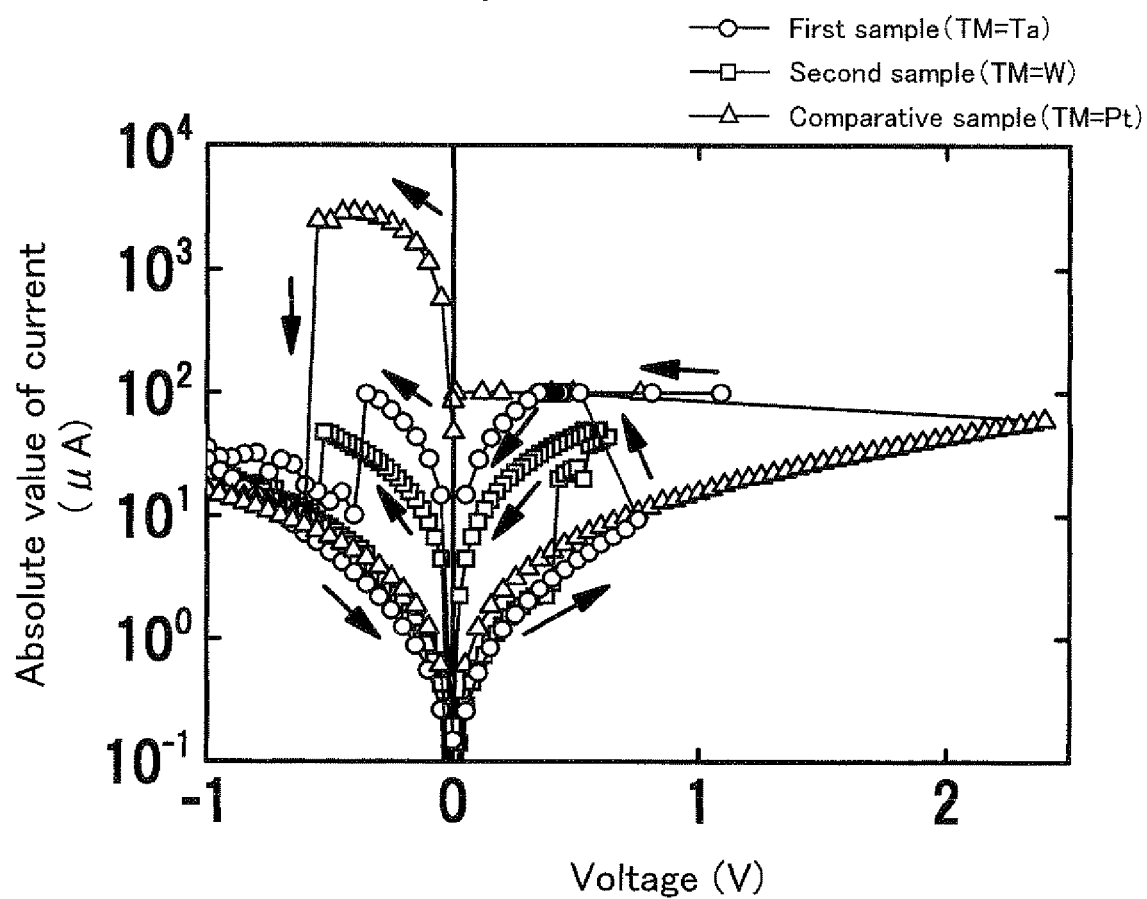
FIG. 12 is a graph showing the current voltage properties of two samples of a variable resistive element according to one embodiment (Example 3) of the present invention and one comparative sample (comparative example).

FIG. 12 shows the IV properties of all the samples in one graph. It was confirmed from the results of the comparison shown in FIG. 12 that the voltages for the setting and resetting operations were both reduced to half or less in the first sample indicated by circles (○) and in the second sample indicated by squares (□) in comparison with the comparative sample indicated by triangles pointing upwards (Δ), and the amounts of current at the time of low resistance were kept as low as approximately 1/30 and 1/75 respectively. It was confirmed that the power consumption could be reduced when an element of which the free energy for generating an oxide was less than that of cobalt (Co), which is the certain element forming the metal oxide layer, was used for the first electrode.

Example 4

Figure 13:
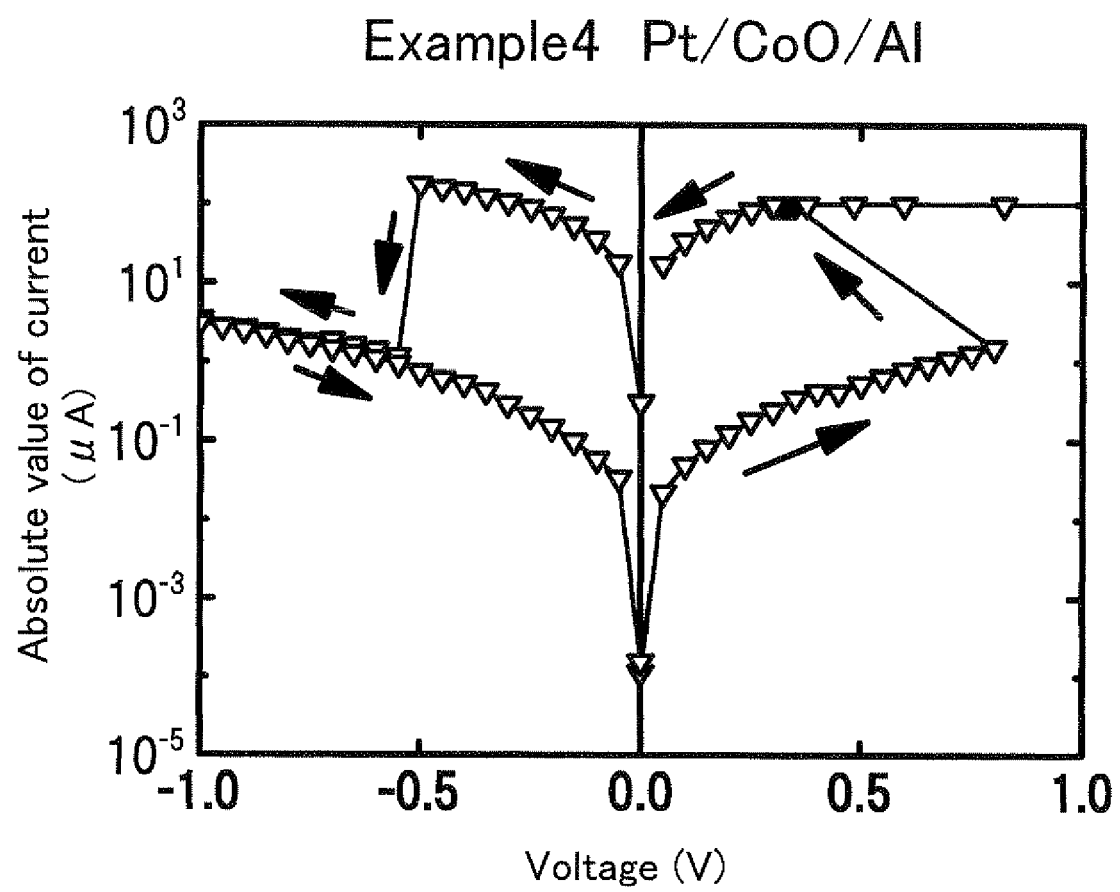
FIG. 13 is a graph showing the current voltage properties of the variable resistive element according to one embodiment (Example 4) of the present invention during the switching operation.
Figure 14:
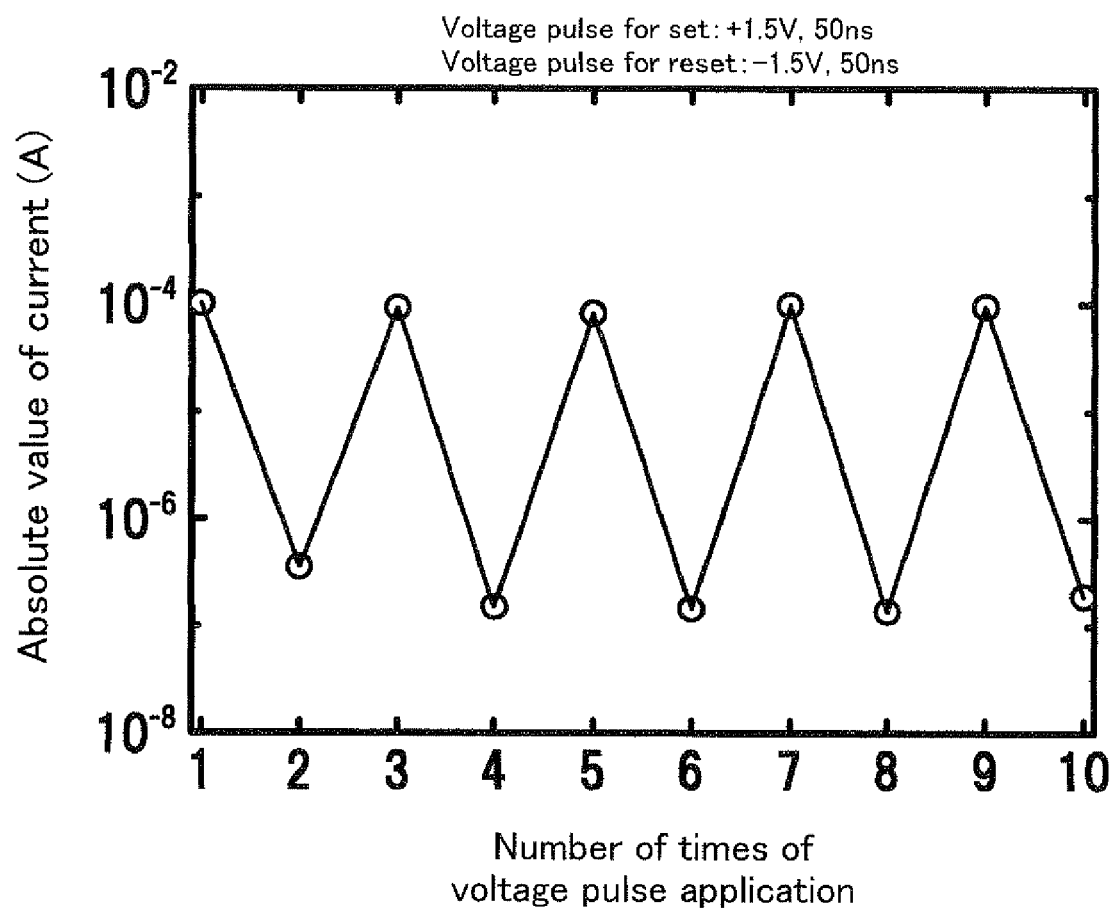
FIG. 14 is a graph showing the switching properties and the electrical resistance (calculated value of current) in a low resistance state and a high resistance state when the variable resistive element according to one embodiment (Example 4) of the present invention carries out a switching operation by applying positive and negative voltage pulses for setting and resetting the variable resistive element.

The original structure of the element according to the present invention was prototyped by forming films on a silicon substrate with a thermally oxidized film in the order of Ti/Pt (second electrode)/cobalt oxide (metal oxide layer)/Al (first electrode)/Pt by the same fabrication method as in Example 1. In addition, a first forming process was carried out by applying a first forming voltage of +8.3 V to the first electrode with reference to the second electrode, and a second forming process for generating an interface oxide was carried out by applying a second forming voltage of −0.56 V. This differed from Example 1 in that the first electrode was Al instead of Ta. FIGS. 13 and 14 show the IV properties at the time of the switching operation of this element according to the present invention and the voltage pulse response (switching properties), respectively. The longitudinal axis of the switching properties in FIG. 14 indicates the current values (absolute values) when +0.2 V was applied across the first and second electrodes. A low consumed current of several hundred μA and a high speed switching operation through the application of a voltage pulse for setting and resetting the variable resistive element of plus and minus 1.5 V for 100 ns were confirmed from FIGS. 13 and 14.

Example 5

Figure 15:
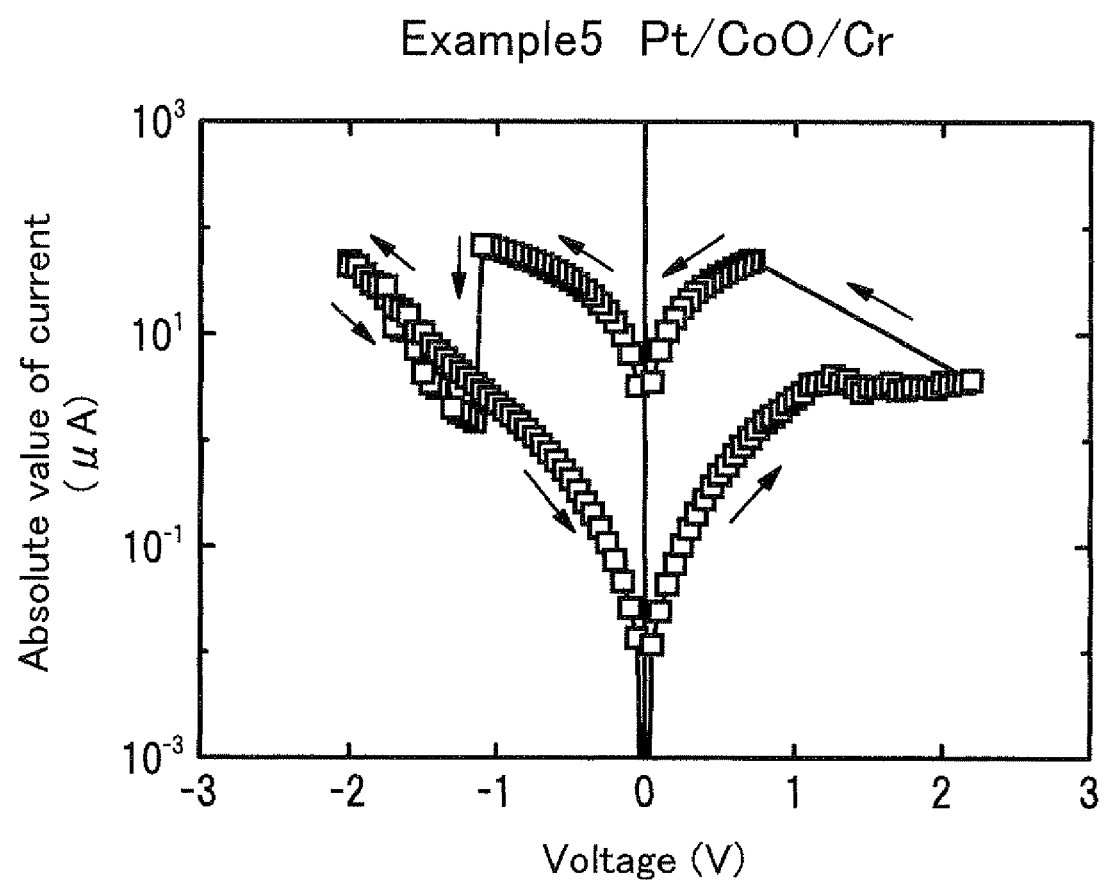
FIG. 15 is a graph showing the current voltage properties when the variable resistive element according to one embodiment (Example 5) of the present invention carries out a switching operation.
Figure 16:
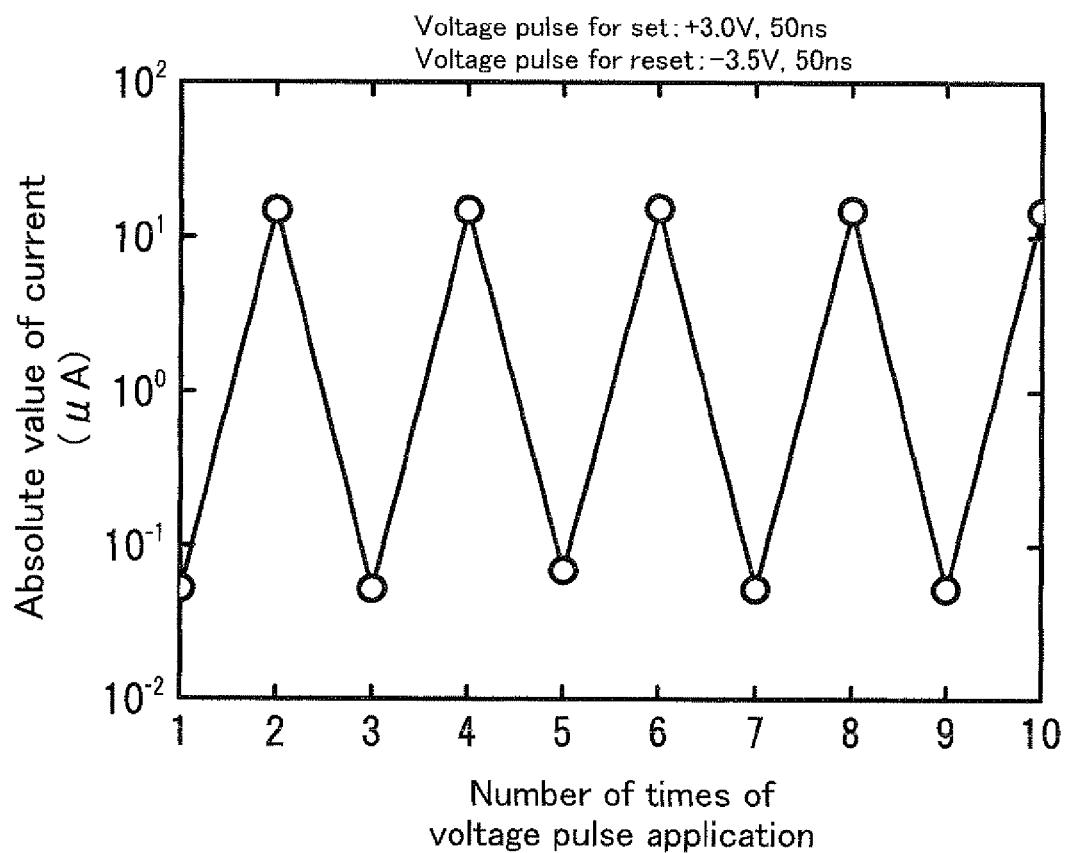
FIG. 16 is a graph showing the switching properties and the electrical resistance (calculated value of current) in a low resistance state and a high resistance state when the variable resistive element according to one embodiment (Example 5) of the present invention carries out a switching operation by applying positive and negative voltage pulses for setting and resetting the variable resistive element.
Figure 18:
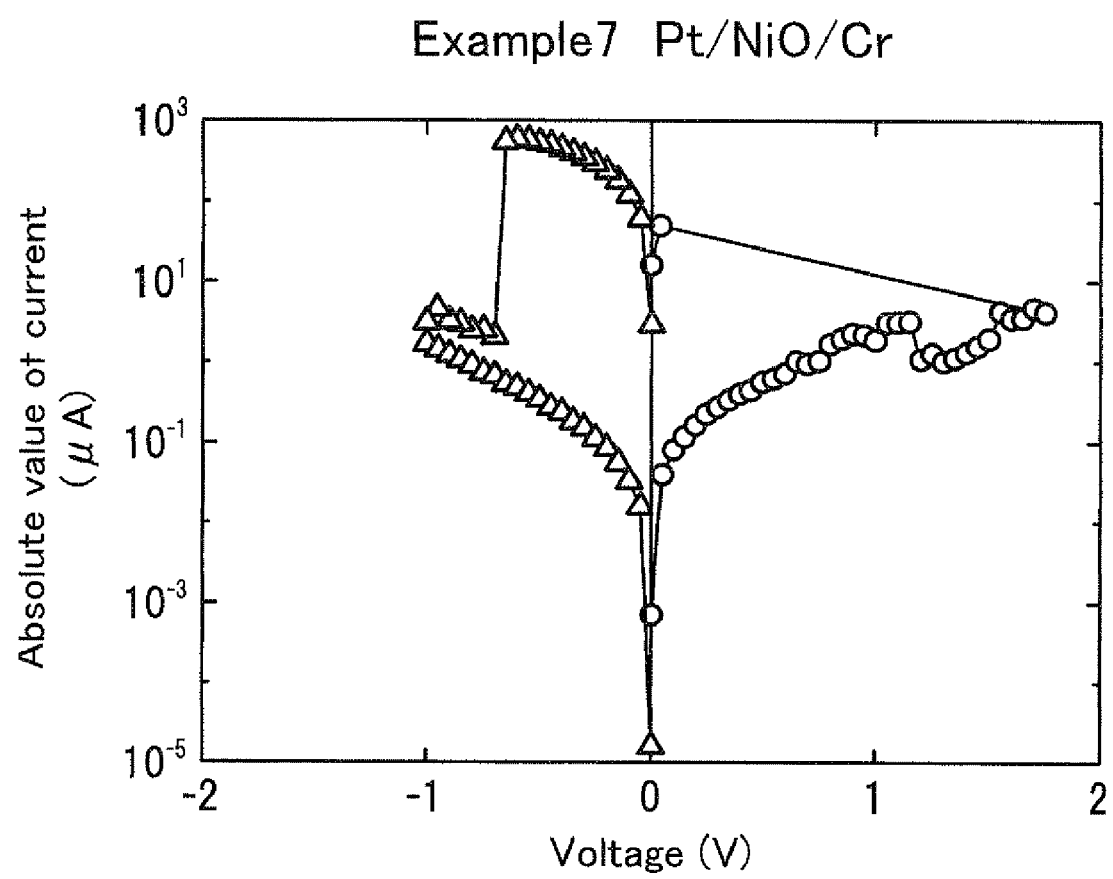
FIG. 18 is a graph showing the current voltage properties of the variable resistive element according to one embodiment (Example 7) of the present invention during the switching operation.

The original structure of the element according to the present invention was prototyped by forming films on a silicon substrate with a thermally oxidized film in the order of Ti/Pt (second electrode)/cobalt oxide (metal oxide layer)/Cr (first electrode)/Pt by the same fabrication method as in Example 1. In addition, a first forming process was carried out by applying a first forming voltage of +8.0 V to the first electrode with reference to the second electrode, and a second forming process for generating an interface oxide was carried out by applying a second forming voltage of −0.97 V. This differs from Example 1 in that the first electrode is Cr instead of Ta. FIGS. 15 and 16 show the IV properties at the time of the switching operation of this element according to the present invention and the voltage pulse response (switching properties), respectively. The longitudinal axis of the switching properties in FIG. 18 shows the current values (absolute values) when a voltage of +0.2 V was applied across the first and second electrodes. A low consumed current of 100 μA and a high speed switching operation through the application of a voltage pulse for setting and resetting the variable resistive element of plus and minus 3.0 V for 50 ns were confirmed from FIGS. 15 and 16.

Example 6

Figure 17:
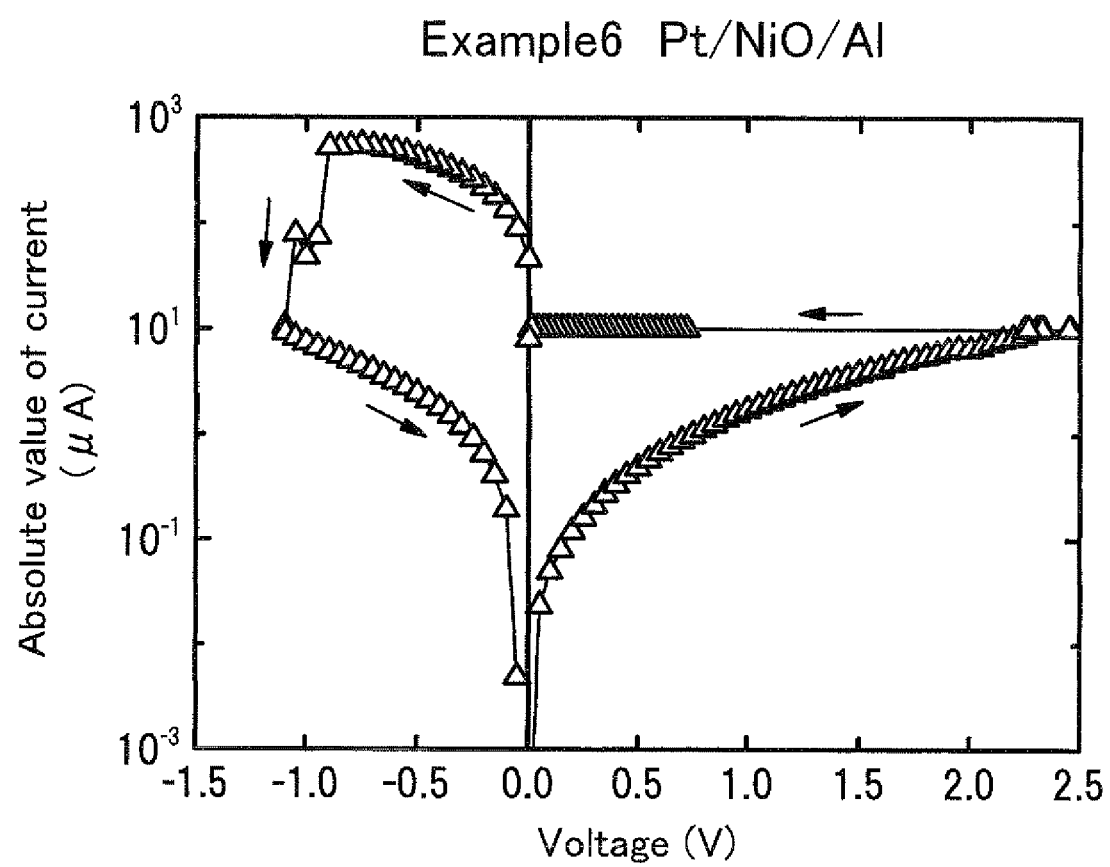
FIG. 17 is a graph showing the current voltage properties of the variable resistive element according to one embodiment (Example 6) of the present invention during the switching operation.

The original structure of the element according to the present invention was prototyped by forming on a silicon substrate with a thermally oxidized film in the order of Ti/Pt (second electrode)/nickel oxide (metal oxide layer)/Al (first electrode)/Pt by the same fabrication method as in Example 1. In addition, a first forming process was carried out by applying a first forming voltage of +13.2 V to the first electrode with reference to the second electrode, and a second forming process for generating an interface oxide was carried out by applying a second forming voltage of −0.91 V. This differs from Example 1 in that the metal oxide layer is nickel oxide instead of cobalt oxide and the first electrode is Al instead of Ta. FIG. 17 shows the IV properties at the time of the switching operation of this element according to the present invention. A switching operation with a low consumed current of 1 mA or less was confirmed from FIG. 17.

Example 7

The original structure of the element according to the present invention was prototyped by forming films on a silicon substrate with a thermally oxidized film in the order of Ti/Pt (second electrode)/nickel oxide (metal oxide layer)/Cr (first electrode)/Pt by the same fabrication method as in Example 1. In addition, a first forming process was carried out by applying a first forming voltage of +10.95 V to the first electrode with reference to the second electrode, and a second forming process for generating an interface oxide was carried out by applying a second forming voltage of −0.75 V. This differs from Example 1 in that the metal oxide layer is nickel oxide instead of cobalt oxide and the first electrode is Cr instead of Ta. FIG. 18 shows the IV properties at the time of the switching operation of this element according to the present invention. A switching operation with a low consumed current of 1 mA or less was confirmed from FIG. 18.

Example 8

Figure 19:
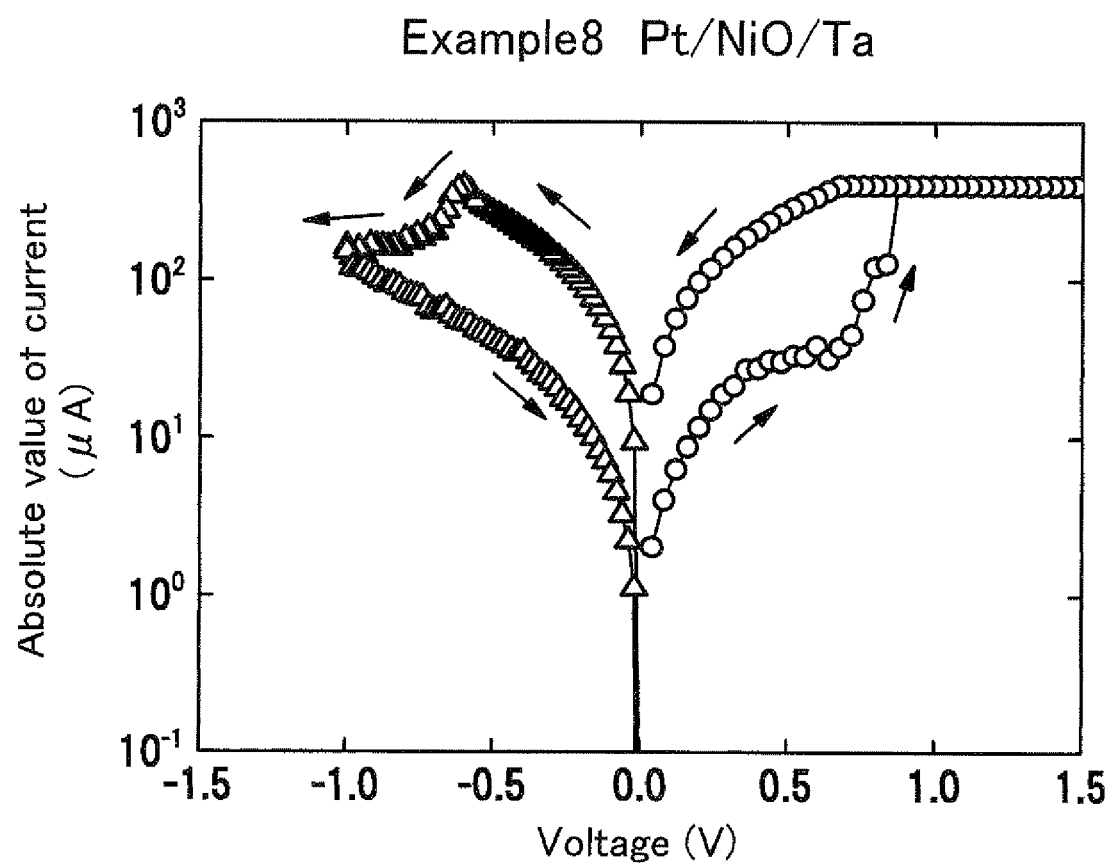
FIG. 19 is a graph showing the current voltage properties of the variable resistive element according to one embodiment (Example 8) of the present invention during the switching operation.

The original structure of the element according to the present invention was prototyped by forming films on a silicon substrate with a thermally oxidized film in the order of Ti/Pt (second electrode)/nickel oxide (metal oxide layer)/Ta (first electrode)/Pt by the same fabrication method as in Example 1. In addition, a first forming process was carried out by applying a first forming voltage of +6.2 V to the first electrode with reference to the second electrode, and a second forming process for generating an interface oxide was carried out by applying a second forming voltage of −0.87 V. This differs from Example 1 in that the metal oxide layer is nickel oxide instead of cobalt oxide. FIG. 19 shows the IV properties at the time of the switching operation of this element according to the present invention. A switching operation with a low consumed current of 1 mA or less was confirmed from FIG. 19.

Example 9

Figure 20:
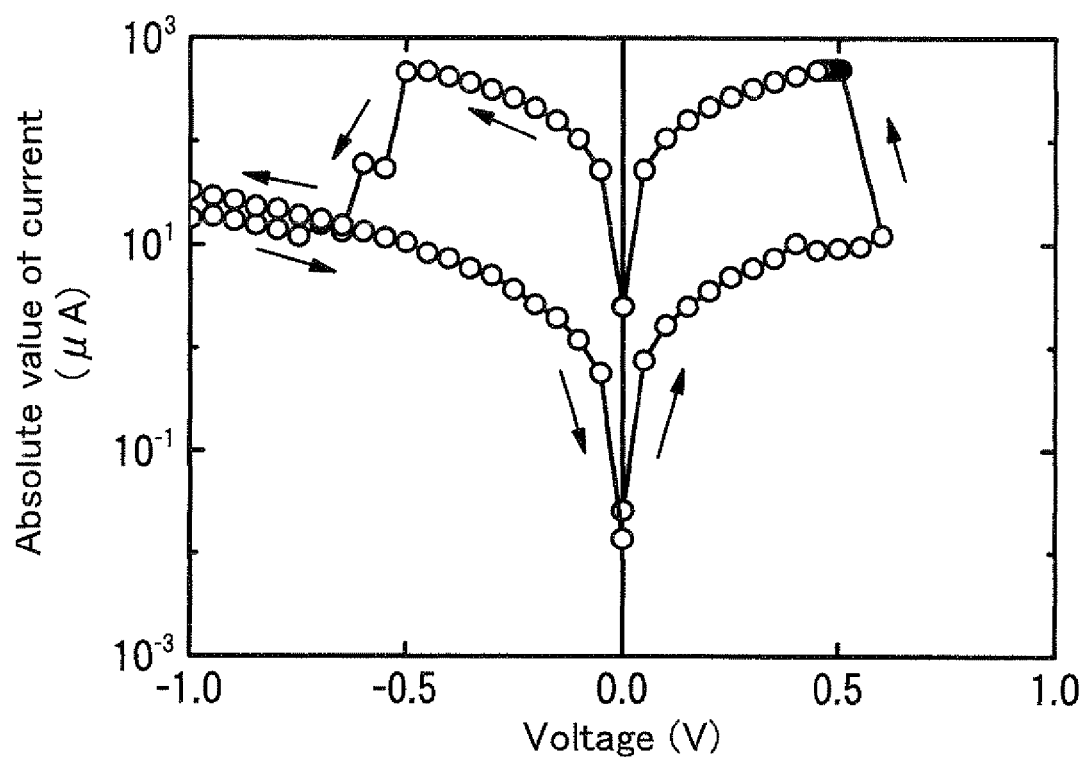
FIG. 20 is a graph showing the current voltage properties of the variable resistive element according to one embodiment (Example 9) of the present invention during the switching operation.

The original structure of the element according to the present invention was prototyped by forming films on a silicon substrate with a thermally oxidized film in the order of Ti/Ta (second electrode)/cobalt oxide (metal oxide layer)/Ta (first electrode)/Pt by the same fabrication method as in Example 1. In addition, a first forming process was carried out by applying a first forming voltage of +3.6 V to the first electrode with reference to the second electrode, and a second forming process for generating an interface oxide was carried out by applying a second forming voltage of −0.77 V. This differs from Example 1 in that the first electrode and the second electrode are both Ta electrodes. FIG. 20 shows the IV properties at the time of the switching operation of this element according to the present invention. A switching operation with a low consumed current of 1 mA or less was confirmed from FIG. 20, even in the case where a material having less free energy for generating an oxide (Ta) was provided on both sides of the metal oxide layer (cobalt oxide).

Example 10

By the same fabrication method as in Example 1, the following five types of samples of the element according to the present invention were prepared on a silicon substrate with a thermally oxidized film: the first sample of the element according to the present invention where films were formed from the bottom in the order of Ti/Pt (second electrode)/cobalt oxide (metal oxide layer)/Ta (first electrode)/Pt (the first electrode is Ta electrode), the second sample of the element according to the present invention where films were formed from the bottom in the order of Ti/Pt (second electrode)/cobalt oxide (metal oxide layer)/Al (first electrode)/Pt (first electrode is Al electrode), a third sample of the element according to the present invention where films were formed from the bottom in the order of Ti/Pt (second electrode)/ cobalt oxide (metal oxide layer)/Cr (first electrode)/Pt (first electrode is Cr electrode), a fourth sample of the element according to the present invention where films were formed from the bottom in the order of Ti/Pt (second electrode)/ cobalt oxide (metal oxide layer)/W (first electrode) (first electrode is W electrode), and a fifth sample of the element according to the present invention where films were formed from the bottom in the order of Ti/Pt (second electrode)/ cobalt oxide (metal oxide layer)/Ti (first electrode) (first electrode is Ti electrode); and whether or not the second forming process could be carried out simultaneously with the first forming process was checked for each variable resistive element.

As described above, the process for forming a filament and the current narrowing process through the formation of an interface oxide are expected to compete with each other when the second forming process is carried out using a current at the time of the first forming process, and therefore, the current at the time of forming was restricted, and the relationship between this restricted value and the resetting current was examined. In addition, in the five samples described above, the current at the time of forming was restricted to a predetermined value, and the first forming process and the second forming process were carried out simultaneously, and thereafter, the resetting operation and the setting operation confirmed that the switching operation was carried out normally.

Figure 21A:
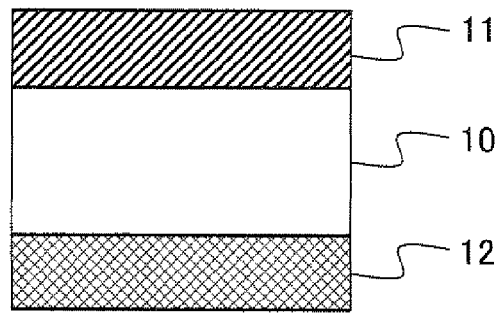
FIGS. 21A to 21C are schematic cross sectional diagrams showing the first and second forming process steps in the manufacturing method for a variable resistive element according to one embodiment (Example 10) of the present invention, and the change in the element structure during the switching operation.
Figure 21B:
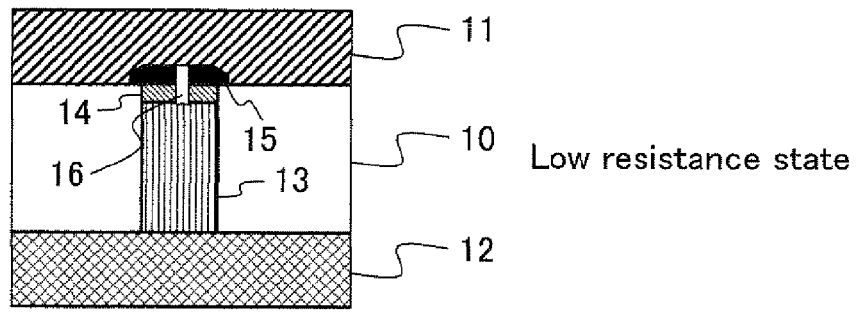
Figure 21C:
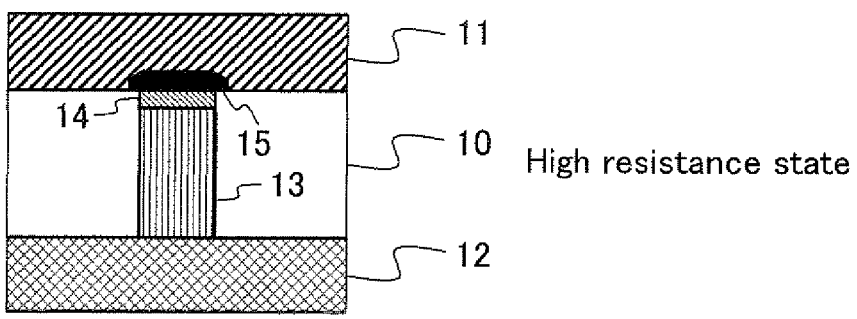
Figure 22A:
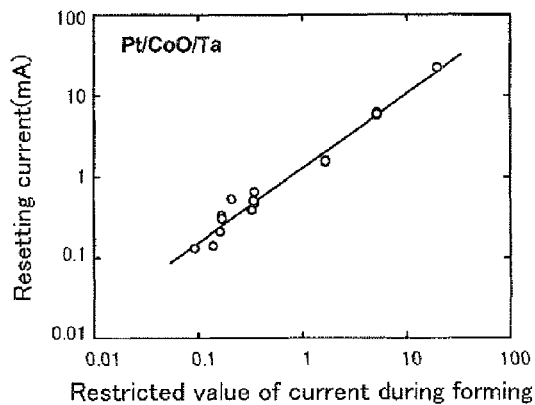
FIGS. 22A to 22E are graphs showing a relationship between current limitation values at the time of formation and the resetting current in the variable resistive element for each sample according to one embodiment (Example 10) of the present invention.
Figure 22D:
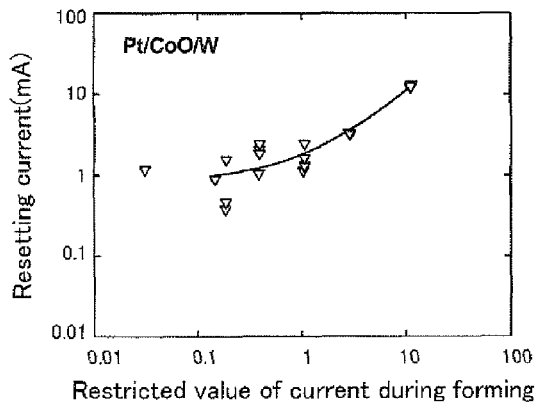
Figure 22B:
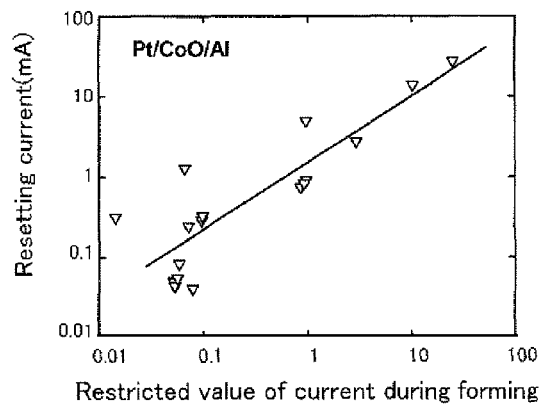
Figure 22E:
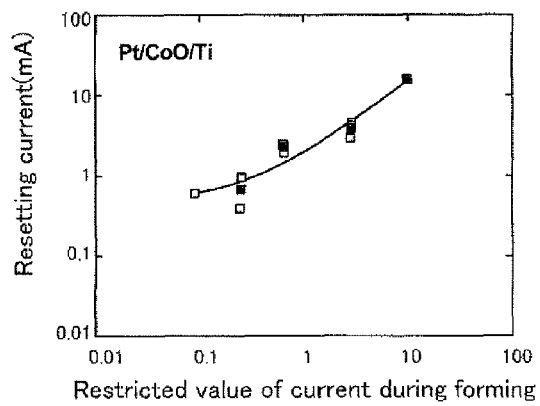
Figure 22C:
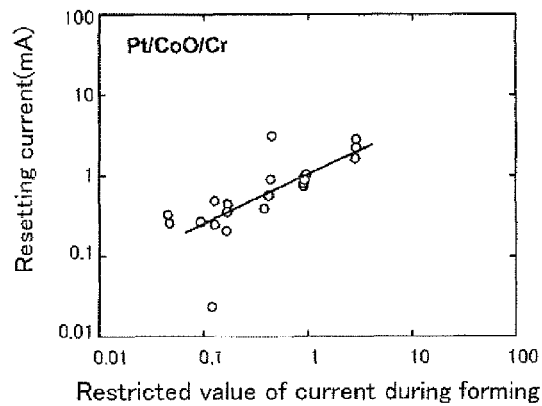

Incidentally, in the case where the first forming process and the second forming process are carried out simultaneously, the element after the forming process is in a low resistance state, unlike the case where the first forming process and the second forming process are carried out in sequence. As a result of the competition between the process for forming a filament and the current narrowing process through the formation of an interface oxide, the progress of the second forming process is restricted so that the interface oxide is not completely formed in the interface between the filament and the certain electrode. Therefore, the filament disconnecting portion is not completely formed, and as a result, it is considered that the same or similar state is gained as a state where an interface oxide and the current narrowing portion penetrating through the filament disconnecting portion are formed when the first forming process and the second forming process are carried out in sequence. That is, the state after the first forming process and the second forming process are carried out simultaneously is considered to be similar to the state shown in FIG. 3D. Accordingly, the Joule heat generated through the resetting operation after the forming process allows the same phenomenon as the second forming process to further progress so that an interface oxide is formed in the interface between the filament and the certain electrode, and a filament disconnecting portion is formed in the interface between the interface oxide and the filament, and thus, a state close to the state shown in FIG. 3C where the current narrowing portion has disappeared is considered to be gained. The cross-sectional structure of the element is considered to change as shown in FIGS. 21A to 21C.

FIGS. 22A to 22E show relationships between the restricted values and the resetting current of each of the above-described five samples. In all of the five samples, when the restricted current values decrease, the resetting current decreases, and the region where the restricted value is approximately 1 mA or less can be divided into two groups having different behaviors. In the case where the first electrode is made of Ta, Al or Cr (FIGS. 22A to 22C: first to third samples), the resetting current decreases as the restricted value decreases even in the region where the current restricted value is 1 mA or less. In the case where the first electrode is made of W or Ti (FIGS. 22D and 22E: fourth and fifth samples), however, the resetting current does not necessarily tend to decrease in the region where the current restricted value is 1 mA or less. It is considered that the resetting current decreases as the restricted current decreases in the region where the restricted current value is 1 mA or more as a result of the thickness of the filament being controlled to a certain extent. This region is dominated by the filament forming process and is considered to be a region that is slightly affected by the interface oxide. The reason why there is a difference in the degree of reduction in the resetting current in the region where the restricted current value is 1 mA or less is considered to be because of a difference in the properties of the generated interface oxide. The composition of an interface oxide generated as a result of competition with the filament formation can be easily expected to be difficult to control. The oxides of W and Ti are known to have a relatively small resistivity depending on the composition, and the interface oxide formed simultaneously during the first forming process is considered not to have a resistivity high enough to be able to narrow the current path. Meanwhile, the oxides of Ta, Al and Cr exhibit a relatively high resistivity irrespective of the composition, and therefore, the effects of squeezing the current path are considered to be easy to gain. That is, in the case where the second forming process is carried out simultaneously with the first forming process, it is desirable to use a metal of which the interface oxide exhibits a high resistivity irrespective of the composition. In the case where the second forming process is carried out after the first forming process, even the W electrode allows for a desired interface oxide to be formed so that the resetting current is reduced, as shown in Example 3 in FIG. 12.

FIGS. 23A to 23E relate to data on the switching properties of the elements of the above-described five samples according to the present invention. FIGS. 23A to 23C show the voltage pulse response (switching properties) in the case where a current restricting resistance (100 kΩ) is inserted in each of the first to third samples in series and a current for formation is restricted to approximately 150 µA, so that the first and second forming processes are carried out simultaneously. As shown in FIG. 23A, the resistance value of the first sample (the first electrode is a Ta electrode) changed in a reversible manner when a voltage pulse of +2.7 V for 20 ns/−2.5 V for 20 ns for setting and resetting the variable resistive element was applied, and thus, a high-speed switching operation was confirmed. As shown in FIG. 23B, the resistance value of the second sample (the first electrode is an Al electrode) changed in a reversible manner when a voltage pulse of +2.5 V for 50 ns/−2.5 V for 50 ns for setting and resetting the variable resistive element was applied, and thus, a high-speed switching operation was confirmed. As shown in FIG. 23C, the resistance value of the third sample (the first electrode is a Cr electrode) changed in a reversible manner when a voltage pulse of +2.8 V for 20 ns/−2.4 V for 100 ns for setting and resetting the variable resistive element was applied, and thus, a high-speed switching operation was confirmed. In addition, FIGS. 23D and 23E show the IV properties when a current restricting resistance (100 kΩ) was inserted in the fourth and fifth samples in series and the current at the time of formation was restricted to approximately 150 µA, so that the first and second forming processes were carried out simultaneously. As shown in FIG. 23D, the resetting current (current indicated by arrow 1 in the figure) in the fourth sample (the first electrode is a W electrode) exceeded 3 mA even when the current at the time of formation was restricted to approximately 150 µA, and in the case where the first forming process and the second forming process were carried out simultaneously, there was a problem such that the resetting current was difficult to suppress, although the switching operation could be carried out. As shown in FIG. 23E, the resetting current (current indicated by arrow 1 in the figure) in the fifth sample (the first electrode is a Ti electrode) was only slightly less than 1 mA, which was not sufficiently low, even in the case where the current at the time of formation was restricted to approximately 150 µA, and in the case where the first forming process and the second forming process were carried out simultaneously, there was a problem such that the resetting current was difficult to suppress, although the switching operation could be carried out, as with the case of the W electrode.

In Examples 1 to 10, it was confirmed that the power consumption could be reduced when an electrode formed of an element of which the free energy for generating an oxide is less than that of the metal element forming the metal oxide layer was used. In addition, it was found that the power required for carrying out the setting and resetting operation could be significantly reduced, and in addition, the speed of the switching operation could significantly increase when an appropriate combination of materials are selected for the metal oxide layer and the certain electrode. Accordingly, in the case where a nonvolatile semiconductor memory device is formed using the element according to the present invention as a memory cell, a high performance nonvolatile semiconductor memory device which can operate at high speed and with low power consumption can be implemented.

Figure 24:
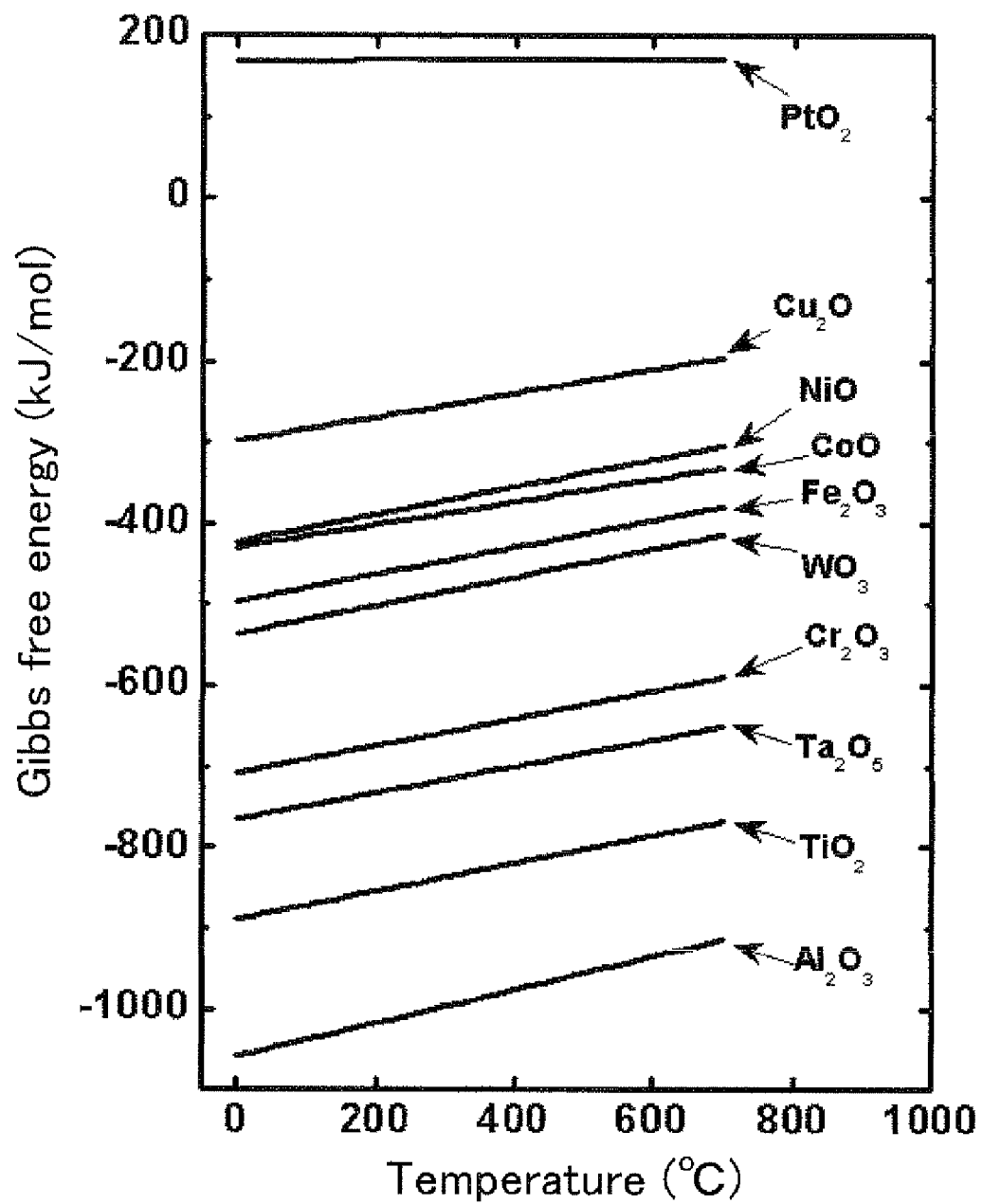
FIG. 24 is an Ellingham diagram showing Gibbs free energy of various metal oxides.

Combinations of materials where the energy for generating the oxide of the element that forms the certain electrode (certain element) is less than the energy for generating a metal oxide can be determined based on an Ellingham diagram in FIG. 24. Gibbs free energy along the longitudinal axis in FIG. 24 is equivalent to the energy for generating an oxide. When the metal oxide is determined, an electrode made of an element that forms an oxide of which the curve is located beneath the curve corresponding to the metal oxide in FIG. 24 may be used as the certain electrode. In the case where CoO is used for the metal oxide, Al, Ti, Ta, Cr or W can be used as the certain electrode, as is clear from FIG. 24. This is the same in the case where NiO is used for the metal oxide. In the case where the metal oxide is $Cu_2O$, the elements in FIG. 24: Ni, Co, Fe, W, Cr, Ta, Ti and Al, can be used for the certain electrode. In the case where an oxide made of a metal element having less energy for generating an oxide, for example, an oxide made of Ta or Ti is used as the metal oxide, only an Al electrode can be used as the certain electrode. The metal oxides in FIG. 24 are merely examples, and a certain electrode can be selected based on the same standard for determination for metal oxides other than those shown here. Accordingly, although CoO and NiO, which are transition metal oxides, are given as examples of the metal oxide layer in Examples 1 to 10, metal oxides other than CoO and NiO can be selected based on the same standard for determination as in the case where the certain electrode is selected.

Second Embodiment

Next, an example of a configuration of a nonvolatile semiconductor memory device using the element according to the present invention as a memory cell (device according to the present invention) is described with reference to FIGS. 25 and 26.

Figure 25:
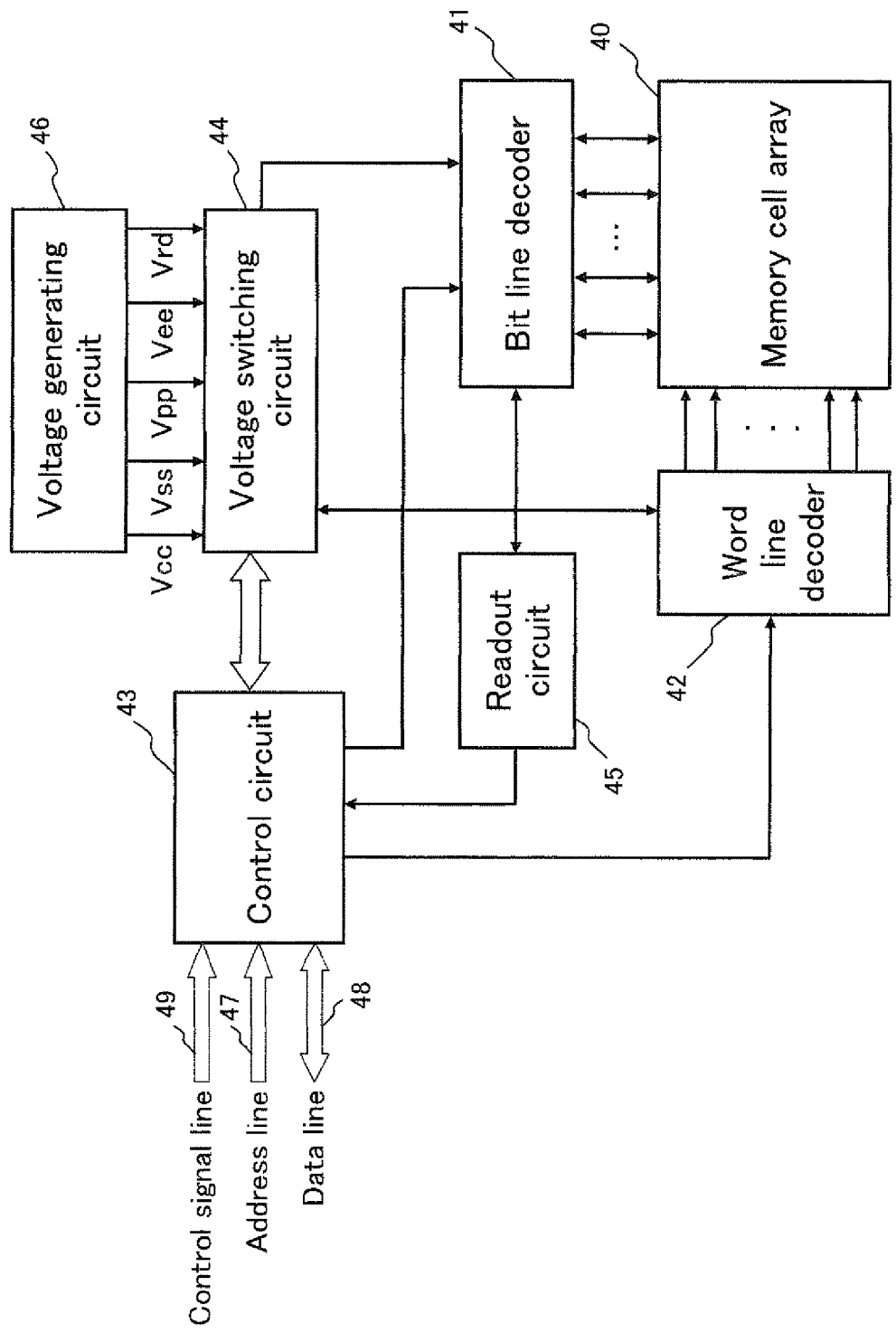
FIG. 25 is a schematic block diagram showing examples of a circuit configuration of a nonvolatile semiconductor memory device according to one embodiment of the present invention.

FIG. 25 schematically shows the configuration of the device according to the present invention. As shown in FIG. 25, the device according to the present invention is formed so that the element according to the present invention described in the first embodiment is used for the memory cells, and the memory cells are aligned in a matrix in row and column directions so that a memory cell array 40 is formed, and a bit line decoder 41, a word line decoder 42, a voltage switching circuit 44, a readout circuit 45, a voltage generating circuit 46 and a control circuit 43 are provided around the periphery of this memory cell array 40.

Figure 26:
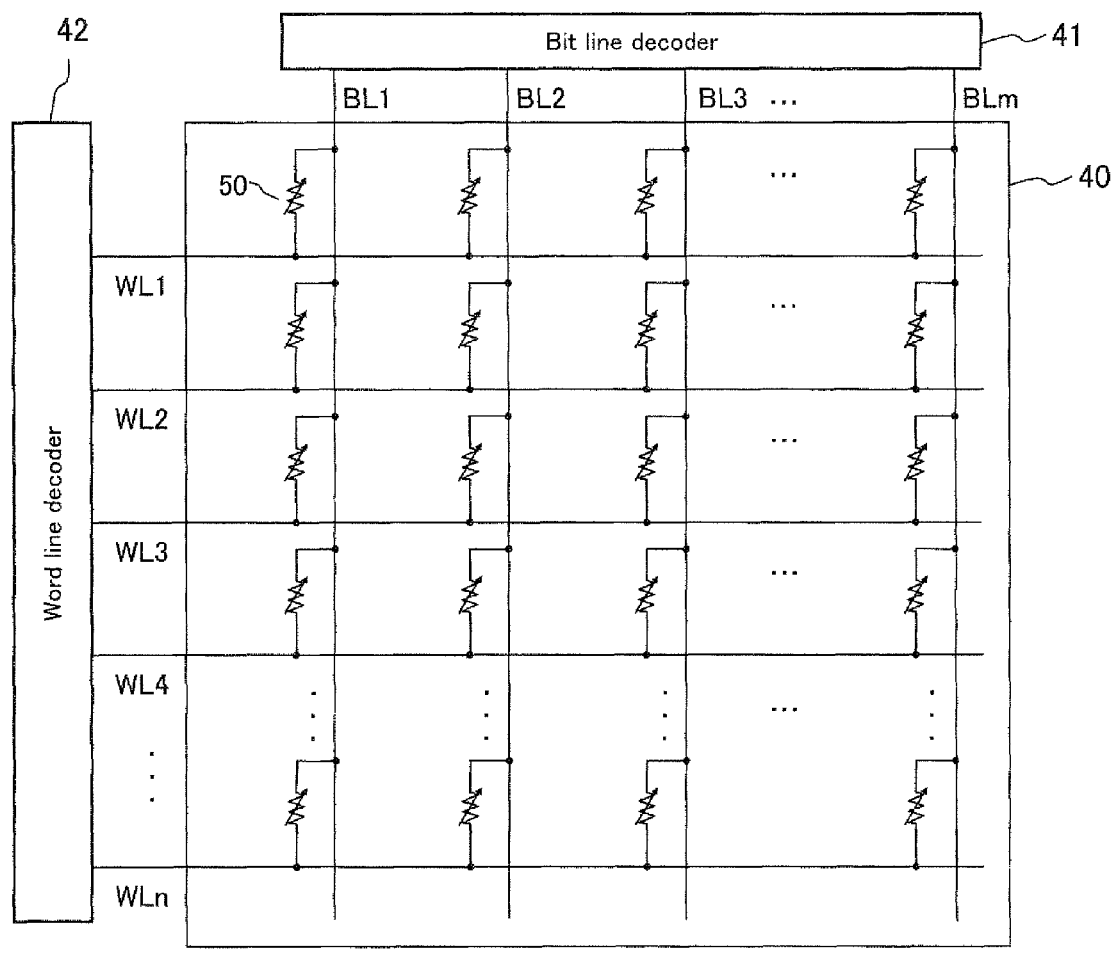
FIG. 26 is a schematic circuit diagram showing an example of a configuration of a cross point type memory cell array in the nonvolatile semiconductor memory device according to one embodiment of the present invention.

As shown in FIG. 26, the memory cell array 40 has a cross point type array structure where m×n memory cells 50 are provided at intersections between m bit lines (column selecting lines) BL1 to BLm which extend in the column direction and n word lines (row selecting lines) WL1 to WLn which extend in the row direction. Specifically, for example, the lower electrodes (second electrodes) of the memory cells 50 in the same column are connected to each other so as to extend in the column direction, forming the bit lines BL1 to BLm, while the upper electrodes (first electrodes) of the memory cells 50 in the same row are connected so as to extend in the row direction, forming the word lines WL1 to WLn.

The bit line decoder 41 and the word line decoder 42 function as memory cell selecting circuits for selecting memory cells in a row unit, in a column unit or in a memory cell unit, and a memory cell to be read out or rewritten is selected from within the memory cell array 40 which corresponds to an address input inputted in the control circuit 43 from an address line 47. The word line decoder 42 selects a word line in the memory cell array 40 which corresponds to a signal inputted in the address line 47, while the bit line decoder 41 selects a bit line in the memory cell array 40 which corresponds to an address signal inputted in the address line 47.

The control circuit 43 controls a writing operation (programming operation and erasing operation) and a readout operation in the memory cell array 40. The programming operation corresponds to the setting operation (switching operation from a high resistance state to a low resistance state) described in the first embodiment, and the erasing operation corresponds to the resetting operation (switching operation from a low resistance state to a high resistance state) described in the first embodiment. The control circuit 43 controls the word line decoder 42, the bit line decoder 41, the voltage switching circuit 44, and readout, programming and erasing operations on the memory cell array 40 based on an address signal inputted from an address line 47, data input inputted from a data line 48 (at the time of programming) and a control input signal inputted from a control signal line 19. In the example shown in FIG. 25, the control circuit 43 functions as a general address buffer circuit, a data input/output buffer circuit and a control input buffer circuit, although not shown in the figure.

The voltage switching circuit 44 functions as a power supplying circuit for switching a voltage for a word line and a bit line required when the memory cell array 40 is read out, programmed or erased in accordance with the operation mode, and supplying the voltage to the memory cell array 40. In the figure, Vcc is the power supply voltage for the device according to the present invention, Vss is the ground voltage, Vpp is the voltage for program, Vee is the voltage for erasure, and Vrd is the voltage for readout. Here, the power supply voltage Vcc and the ground voltage Vss are supplied to the voltage switching circuit 44 from outside the device according to the present invention, and the voltages for readout, program and erasure are generated inside the device according to the present invention, from the power supply voltage Vcc or other power supply voltages by means of the voltage generating circuit 46, for example, but the concrete configuration is not central to the present invention, and therefore, the description thereof is not given.

The readout circuit 45 converts the voltage of the readout current flowing through a selection bit line selected by the bit line decoder 41 from among the readout currents flowing through the bit lines connected to the selected memory cells, determines the state of storage data in the memory cell to be read out which is connected to the selection bit line from among the selected memory cells in one row, transfers the results to the control circuit 43, and outputs them to the data line 48.

Next, an example of application of a voltage to a memory cell array at the time of the programming and erasing operations will be described. The element according to the present invention described in the first embodiment, which is used for the memory cells 50 in the present embodiment, has the switching properties shown in FIGS. 11 to 20, for example, and therefore, the electrical resistance is switched from a high resistance state to a low resistance state when a positive voltage pulse is applied on the upper electrode side with reference to the lower electrode, and conversely, the electrical resistance is switched from a low resistance state to a high resistance state when a negative voltage pulse is applied on the upper electrode side with reference to the lower electrode. In the following description, there is assumed a case where the switching operation is not carried out when a voltage pulse having a voltage amplitude which is half of each voltage pulse is applied.

Accordingly, at the time of the programming operation, the ground voltage Vss (0 V) is applied to the selection bit line connected to the selected memory cell to be programmed, and the voltage for program Vpp is applied to the selection word line connected to the selected memory cell, and thus, the positive voltage for program Vpp is applied to the upper electrode (selection word line side) with reference to the lower electrode (selection bit line side) of the selected memory cell, so that the programming operation is carried out. At this time, a voltage which is half of the voltage for program Vpp (Vpp/2) is applied to unselected bit lines and unselected word lines that are not connected to the selected memory cell, so that no voltage is applied across the two ends of the first unselected memory cell, which are connected to the unselected bit line and the unselected word line, while a positive voltage (Vpp/2) is applied on the upper electrode side with reference to the lower electrode across the two ends of the second unselected memory cell connected to a selected bit line and an unselected word line and the third unselected memory cell connected to an unselected bit line and a selected word line, and thus, no programming operation is carried out in the unselected memory cells.

In addition, at the time of the erasing operation, the voltage for erasure Vee is applied to the selected bit line connected to the selected memory cell to be erased, and the ground voltage Vss (0 V) is applied to the selected word line connected to the selected memory cell, so that a negative voltage for erasure (−Vee) is applied to the upper electrode (selected word line side) with reference to the lower electrode (selected bit line side) of the selected memory cell and an erasing operation is carried out. At this time, a voltage that is half of the voltage for erasure Vee (Vee/2) is applied to an unselected bit line and an unselected word line which are not connected to the selected memory cell, so that no voltage is applied across the two ends of the first unselected memory cell connected to the unselected bit line and the unselected word line, while a negative voltage (−Vee/2) is applied on the upper electrode side with reference to the lower electrode across the two ends of the second unselected memory cell connected to a selected bit line and an unselected word line and the third unselected memory cell connected to an unselected bit line and a selected word line, and thus, no erasing operation is carried out in the unselected memory cells.

In this case, at the time of the programming operation, the ground voltage Vss and the voltage (Vpp/2) are applied to a selected bit line and an unselected bit line, respectively, via the bit line decoder 41, while the voltage for program Vpp and the voltage (Vpp/2) are applied to a selected word line and an unselected word line, respectively, via the word line decoder 42. In addition, at the time of the erasing operation, the voltage for erasure (Vee) and the voltage (Vee/2) are applied to a selected bit line and an unselected bit line, respectively, via the bit line decoder 41, while the ground voltage Vss and the voltage (Vee/2) are applied to a selected word line and an unselected word line, respectively, via the word line decoder 42. Accordingly, in the present embodiment, the bit line decoder 41 and the word line decoder 42, the control circuit 43 for controlling the decoders, and the voltage switching circuit 44 for supplying a voltage for program Vpp and a voltage for erasure Vee to the respective decoders functions as means for writing information in the memory cell array 40.

Next, an example of application of a voltage to the memory cell array at the time of the readout operation will be described. The voltage for readout Vrd is applied to the selected bit line connected to the selected memory cell to be read out, and the ground voltage Vss (0 V) is applied to the selected word line connected to the selected memory cell, so that a voltage for readout (Vrd) is applied to the lower electrode (selected bit line side) with reference to the upper electrode (selected word line side) of the selected memory cell, and a readout current corresponding to the resistance state flows through the selected memory cell from the selected bit line to the selected word line. This readout current is detected by the readout circuit 45 via the bit line decoder 41, and thus, a readout operation is carried out.

In the second embodiment, although the upper electrodes form word lines and the lower electrodes form bit lines, the upper electrodes may form bit lines and the lower electrodes may form word lines. In addition, although the readout circuit 45 is provided on the bit line side for the readout operation, it may be provided on the word line side.

Furthermore, although in the second embodiment, 1R type memory cells formed only of the element according to the present invention are assumed in the configuration of the memory cells using the element according to the present invention described in the first embodiment, the memory cell array may have an 1D/1R type memory cell structure where the element according to the present invention and a rectifying element, such as a diode, are connected in series or an 1T/1R type memory cell structure formed of a series circuit of the element according to the present invention and a selection transistor MOSFET, bipolar transistor or the like).

INDUSTRIAL APPLICABILITY

The present invention is applicable to a variable resistive element which can store information when an electrical resistance changes in accordance with application of an electrical stress, a manufacturing method for the same, and a nonvolatile semiconductor memory device.

The invention claimed is:
1. A variable resistive element comprising:
a metal oxide layer between a first electrode and a second electrode where an electrical resistance between the first and second electrodes reversibly changes in accordance with application of an electrical stress across the first and second electrodes, wherein
the metal oxide layer has a filament which is a current path where a density of a current flowing between the first and second electrodes is locally high,
a portion including at least a vicinity of an interface between a certain electrode, which is one or both of the first and second electrodes, and the filament, on an interface between the certain electrode and the metal oxide layer is provided with an interface oxide which is an oxide of a certain element and different from an oxide of the metal oxide layer, the certain element being at least one element included in the certain electrode, and
the variable resistive element further comprising a current narrow portion where the current path of the filament is narrowed by the interface oxide in a vicinity of a contact point between the filament and the interface oxide.

2. A variable resistive element comprising:
a metal oxide layer between a first electrode and a second electrode where an electrical resistance between the first and second electrodes reversibly changes in accordance with application of an electrical stress across the first and second electrodes, wherein
the metal oxide layer has a filament which is a current path where a density of a current flowing between the first and second electrodes is locally high,
a portion including at least a vicinity of an interface between a certain electrode, which is one or both of the first and second electrodes, and, the filament, on an interface between, the certain electrode and the metal oxide layer is provided with an interface oxide which is an oxide of a certain element and different from an oxide of the metal oxide layer, the certain element being at least one element included in the certain electrode, and
a thermal conductivity of the interface oxide is lower than a thermal conductivity of the certain electrode.

3. A variable resistive element comprising:
a metal oxide layer between a first electrode and a second electrode where an electrical resistance between the first and second electrodes reversibly changes in accordance with a application of an electrical stress across the first and second electrodes, wherein
the metal oxide layer has a filament which is a current path where a density of a current flowing between the first and second electrodes is locally high,
a portion including at least a vicinity of an interface between a certain electrode, which is one or both of the first and second electrodes, and the filament, on an interface between the certain electrode and the metal oxide layer is provided with an interface oxide which is an oxide of a certain element and different from an oxide of the metal oxide layer, the certain element being at least one element included in the certain electrode, and
free energy for generating an oxide in the certain element is less than free energy for generating an oxide in a metal element that forms the metal oxide layer.

4. The variable resistive element according to claim 2, wherein the metal oxide layer is made of a metal oxide including a transition metal.

5. The variable resistive element according to claim 4, wherein the metal oxide layer is an oxide of at least one transition metal selected from Co, Ni, Ti, V, Cu, W, Nb and Mn.

6. The variable resistive element according to claim 4, wherein the certain electrode includes at least one element that is selected from W, Cr, Ta and Al and different from the transition metal included in the metal oxide layer.

7. The variable resistive element according to claim 3, wherein the electrical resistance between the first and second electrodes reversibly changes when oxygen moves between the interface oxide and the metal oxide.

8. The variable resistive element according to claim 2, wherein the electrical resistance between the first and second electrodes increases when one of the first electrode and the second electrode is used as a reference and a first voltage pulse having a positive or negative polarity is applied to the other electrode, and the electrical resistance between the first and second electrodes decreases when a second voltage pulse having a polarity opposite to the first voltage pulse is applied to the other electrode.

9. The variable resistive element according to claim 2, wherein duration of a first voltage pulse which is applied across the first and second electrodes in order to increase the electrical resistance between the first and second electrodes and duration of a second voltage pulse which is applied across the first and second electrodes in order to decrease the electrical resistance between the first and second electrodes are 100 ns or less.

10. A manufacturing method for a variable resistive element, the manufacturing method comprising:
    forming an original structure for the variable resistive element having the a metal oxide layer between a first electrode and a second electrode where an electrical resistance between the first and second electrodes reversibly changes in accordance with application of an electrical stress across the first and second electrodes;
    forming a filament which is a current path where a density of a current flowing through the metal oxide layer between the first and second elements is locally high by applying a first forming voltage across the first and second electrodes in the original structure; and
    forming an interface oxide in a portion including at least a vicinity of an interface between a certain electrode, which is one or both of the first and second electrodes, and the filament, on an interface between the certain electrode and the metal oxide layer, the interface oxide being an oxide of a certain element which is at least one element included in the certain electrode and being different from an oxide in the metal oxide layer, wherein
    the original structure forming step, the filament forming step and the interface oxide forming step are carried out in sequence, and
    the interface oxide is generated when the certain element in the certain electrode grabs oxygen in the metal oxide layer through the interface in the interface oxide forming step.

11. The manufacturing method according to claim 10, wherein a filament disconnecting portion having a high resistance for suppressing current conduction in the filament is formed in the interface between the filament and the interface oxide in addition to formation of the interface oxide in the interface oxide forming step.

12. The manufacturing method according to claim 11, wherein a current path penetrating through the filament disconnecting portion and the interface oxide is formed by applying a voltage across the first and second electrodes in order to decrease the electrical resistance between the first and second electrodes, so that a current narrow portion where the current path in the filament is narrowed is formed in a vicinity of a contact point between the filament and the interface oxide after the interface oxide forming step.

13. The manufacturing method according to claim 10, wherein the certain electrode and the metal oxide layer are formed in the original structure forming step so that free energy for generating an oxide of the certain element included in the certain electrode is less than free energy for generating an oxide of a metal element that forms the metal oxide layer.

14. The manufacturing method according to claim 10, wherein the interface oxide is generated by applying a second forming voltage across the first and second electrodes in the interface oxide forming step.

15. The manufacturing method according to claim 10, wherein the interface oxide is generated by carrying out heat treatment on the interface between the certain electrode and the metal oxide layer in the interface oxide forming step.

16. The manufacturing method according to claim 10, wherein, the interface oxide forming step is carried out in parallel with the filament forming step using a current that flows during the filament forming step.

17. The manufacturing method according to claim 16, wherein a current is restricted to 1 mA or less during the filament forming step.

18. The manufacturing method according to claim 16, wherein the interface oxide is generated when the certain element in the certain electrode grabs oxygen in the metal oxide layer through the interface in the interface oxide forming step.

19. The manufacturing method according to claim 18, wherein a current narrow portion where the current path of the filament is narrowed by the interface oxide is generated in a vicinity of a contact point between the filament and the interface oxide in the interface oxide forming step.

20. The manufacturing method according to claim 19, wherein a filament disconnecting portion having a high resistance for restricting current conduction of the filament is formed in an interface between the filament and the interface oxide by applying a voltage across the first and second electrodes in order to increase the electrical resistance between the first and second electrodes after the interface oxide forming step.

21. The manufacturing method according to claim 18, wherein the certain electrode and the metal oxide layer are formed in the original structure forming step so that free energy for generating an oxide of the certain element included in the certain electrode is less than free energy for generating an oxide of a metal element that forms the metal oxide layer.

22. A non-volatile semiconductor memory device comprising:
    a memory cell having the variable resistive element according to claim 2;
    information writing means for programming and erasing information by applying power across two ends of the variable resistive element and changing an electrical resistance; and
    information readout means for reading out stored information by applying a readout voltage across the two ends of the variable resistive element and detecting an electrical resistance state from an amount of current flowing through the variable resistive element.

23. The variable resistive element according to claim 3, wherein the metal oxide layer is made of a metal oxide including a transition metal.

24. The variable resistive element according to claim 23, wherein the metal oxide layer is an oxide of at least one transition metal selected from Co, Ni, Ti, V, Cu, W, Nb and Mn.

25. The variable resistive element according to claim 23, wherein the certain electrode includes at least one element that is selected from W, Cr, Ta and Al and different from the transition metal included in the metal oxide layer.

* * * * *